United States Patent
Maeda et al.

(10) Patent No.: US 7,294,956 B2
(45) Date of Patent: Nov. 13, 2007

(54) SEMICONDUCTOR LIGHT EMITTING ELEMENT AND LIGHT EMITTING DEVICE USING THIS

(75) Inventors: Toshihide Maeda, Kagoshima (JP); Shozo Oshio, Hirakata (JP); Katsuaki Iwama, Suita (JP); Hiromi Kitahara, Kagoshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 182 days.

(21) Appl. No.: 10/491,411

(22) PCT Filed: Sep. 27, 2002

(86) PCT No.: PCT/JP02/10128

§ 371 (c)(1),
(2), (4) Date: Apr. 1, 2004

(87) PCT Pub. No.: WO03/032407

PCT Pub. Date: Apr. 17, 2003

(65) Prior Publication Data
US 2004/0245532 A1 Dec. 9, 2004

(30) Foreign Application Priority Data
Oct. 1, 2001 (JP) ............................... 2001-305032

(51) Int. Cl.
*H01J 1/63* (2006.01)
*H01L 31/055* (2006.01)

(52) U.S. Cl. ...................... 313/486; 313/501; 313/512; 257/89; 257/E33.061; 257/98; 252/301.4 S; 252/301.4 P; 252/301.4 H; 252/301.4 R

(58) Field of Classification Search .................. 313/503
See application file for complete search history.

(56) References Cited

U.S. PATENT DOCUMENTS 5,998,925 A * 12/1999 Shimizu et al. ............. 313/503

(Continued)

FOREIGN PATENT DOCUMENTS

EP    0921568    9/1999

(Continued)

OTHER PUBLICATIONS

Thomas L. Barry, "Fluorescence of $EU^{2+}$-Activated Phases in Bunary Alkaline Earth Orthosilicate Systems", J. Electrochemical Soc., Solid State Science, vol. 115, No. 11, pp. 1181-1184, Nov. 1968.

(Continued)

*Primary Examiner*—Sileho Roy
*Assistant Examiner*—Natalie K. Walford
(74) *Attorney, Agent, or Firm*—McDermott Will & Emery LLP

(57) ABSTRACT

The semiconductor light emitting device is composed of a combination of a near ultraviolet LED and a phosphor layer including a plurality of phosphors for absorbing near ultraviolet emitted by the near ultraviolet LED and for emitting fluorescence having an emission peak in a visible wavelength region, and the phosphor layer includes four kinds of phosphors, that is, a blue-based phosphor, a green-based phosphor, a red-based phosphor and a yellow-based phosphor. Thus, lowering of luminous flux derived from red-based light with low luminosity is compensated by yellow-based light with comparatively high luminosity, and the resultant white-based light can be well color balanced, and hence, a semiconductor light emitting device emitting white-based light with high luminous flux and a large Ra can be obtained.

6 Claims, 15 Drawing Sheets

U.S. PATENT DOCUMENTS

| | | | |
|---|---|---|---|
| 6,084,250 A * | 7/2000 | Justel et al. | 257/89 |
| 6,656,608 B1 * | 12/2003 | Kita et al. | 428/690 |
| 7,083,302 B2 * | 8/2006 | Chen et al. | 362/231 |
| 2004/0104391 A1 * | 6/2004 | Maeda et al. | 257/79 |

FOREIGN PATENT DOCUMENTS

| | | |
|---|---|---|
| JP | 11-039917 | 2/1999 |
| JP | 11-163418 | 6/1999 |
| JP | 11-246857 | 9/1999 |
| JP | P2000-183408 | 6/2000 |
| JP | P2000-509912 | 8/2000 |
| JP | 2000-347601 | 12/2000 |
| JP | P2001-143869 | 5/2001 |
| WO | WO 98/39805 | 9/1998 |

OTHER PUBLICATIONS

S.H.M. Poort et al., "Optical Properties of EU$^{2+}$-Activated Orthosilicates and Orthophosphates", Journal of Alloys and Compounds, 1997, No. 260, pp. 93 to 97.

S.H.M. Poort et al., "Optical properties of Eu$^{2+}$-activated orthosilicates and orthophosphates," Journal of Alloys and Compounds 260 (1997) pp. 93-97 Elsevier Science S.A.

Jan. 16, 2007 JP Office Action and English translation.

* cited by examiner

US 7,294,956 B2

SEMICONDUCTOR LIGHT EMITTING ELEMENT AND LIGHT EMITTING DEVICE USING THIS

TECHNICAL FIELD

The present invention relates to a semiconductor light emitting device and a light emitting apparatus for emitting white-based light through a combination of a near ultraviolet light emitting diode (hereinafter referred to as a near UV LED) and a plurality of phosphors.

BACKGROUND ART

There conventionally is a known semiconductor light emitting device for emitting white-based light that is composed of a combination of a near UV LED (strictly speaking, a near UV LED chip) having an emission peak in a wavelength region of near UV exceeding 350 nm and not more than 410 nm and a phosphor layer including a plurality of inorganic phosphors each emitting fluorescence having an emission peak in a visible light wavelength range not less than 380 nm and not more than 780 nm. The semiconductor light emitting device using the inorganic phosphors is widely used because it has higher durability than a semiconductor light emitting device using organic phosphors.

It is noted that light having a luminescent chromaticity point (x, y) in the CIE chromaticity diagram of $0.21 \leq x \leq 0.48$ and $0.19 \leq y \leq 0.45$ is herein defined as white-based light.

Such known semiconductor light emitting devices are disclosed in, for example, Japanese Laid-Open Patent Publication Nos. 11-246857, 2000-183408, 2000-509912 and 2001-143869.

Japanese Laid-Open Patent Publication No. 11-246857 describes a semiconductor light emitting device using, as a red phosphor, a lanthanum oxysulfide phosphor represented by a general formula, $(La_{1-x-y}Eu_xSm_y)_2O_2S$ (wherein $0.01 \leq x \leq 0.15$ and $0.0001 \leq y \leq 0.03$) to be combined with a near UV LED for emitting light of a wavelength of approximately 370 nm having a light emitting layer made of a gallium nitride-based compound semiconductor. Also, Japanese Laid-Open Patent Publication No. 11-246857 discloses a technique related to a semiconductor light emitting device for emitting white-based light with an arbitrary color temperature composed of an appropriate combination of the red phosphor and other blue and green phosphors.

Japanese Laid-Open Patent Publication No. 2000-183408 describes a semiconductor light emitting device composed of a UV LED chip having a light emitting layer made of a gallium nitride-based compound semiconductor for emitting UV with an emission peak in the vicinity of 370 nm, a first phosphor layer including a blue phosphor for absorbing the UV and emitting blue light and a second phosphor layer including a yellow/orange phosphor for absorbing the blue light and emitting yellow/orange light. As the blue phosphor, at least one kind of blue phosphor selected from the following (1) through (3) is used:

(1) A bivalent europium-activated halophosphate phosphor substantially represented by a general formula, $(M1, Eu)_{10}(PO_4)_6Cl_2$ (wherein M1 is at least one element selected from the group consisting of Mg, Ca, Sr and Ba);

(2) a bivalent europium-activated aluminate phosphor substantially represented by a general formula, $a(M2, Eu)O-bAl_2O_3$ (wherein M2 is at least one element selected from the group consisting of Mg, Ca, Sr, Ba, Zn, Li, Rb and Cs, and a and b are numerical values satisfying a>0, b>0 and $0.2 \leq a/b \leq 1.5$; and (3) a bivalent europium/manganese-activated aluminate phosphor substantially represented by a general formula, $a(M2, Eu_v, Mn_w)O-bAl_2O_3$ (wherein M2 is at least one element selected from the group consisting of Mg, Ca, Sr, Ba, Zn, Li, Rb and Cs, and a, b, v and w are numerical values satisfying a>0, b>0, $0.2 \leq a/b \leq 1.5$ and $0.001 \leq w/v \leq 0.6$.

Also, as the yellow/orange phosphor, a trivalent cerium-activated aluminate phosphor substantially represented by a general formula, $(Y_{1-x-y}Gd_xCe_y)_3Al_5O_{12}$ (wherein x and y are numerical values satisfying $0.1 \leq x \leq 0.55$ and $0.01 \leq y \leq 0.4$) (hereinafter referred to as a YAG-based phosphor) is used.

Furthermore, Japanese Laid-Open Patent Publication No. 2000-509912 discloses a semiconductor light emitting device composed of a combination of a UV LED having an emission peak in a wavelength region not less than 300 nm and not more than 370 nm, a blue phosphor having an emission peak in a wavelength region not less than 430 nm and not more than 490 nm, a green phosphor having an emission peak in a wavelength region not less than 520 nm and not more than 570 nm, and a red phosphor having an emission peak in a wavelength region not less than 590 nm and not more than 630 nm. In this semiconductor light emitting device, $BaMgAl_{10}O_{10}O_{17}:Eu$, $Sr_5(PO_4)_3Cl:Eu$ or ZnS:Ag (both having an emission peak wavelength of 450 nm) is used as the blue phosphor, ZnS:Cu (having an emission peak wavelength of 550 nm) or $BaMgAl_{10}O_{17}:Eu$, Mn (having an emission peak wavelength of 515 nm) is used as the green phosphor, and $Y_2O_2S:Eu^{3+}$ (having an emission peak wavelength of 628 nm), $YVO_4:Eu^{3+}$ (having an emission peak wavelength of 620 nm), $Y(V, P, B)O_4:Eu^{3+}$ (having an emission peak wavelength of 615 nm), $YNbO_4:Eu^{3+}$ (having an emission peak wavelength of 615 nm), $YTaO_4:Eu^{3+}$ (having an emission peak wavelength of 615 nm), or $[Eu(acac)_3(phen)]$ (having an emission peak wavelength of 611 nm) is used as the red phosphor.

On the other hand, Japanese Laid-Open Patent Publication No. 2001-1438769 discloses a semiconductor light emitting device composed of a combination of an organic LED including an organic material as a light emitting layer and having an emission peak in a wavelength region ranging between blue violet and near UV of 430 nm or less, or an inorganic LED including an inorganic material as a light emitting layer and having an emission peak in the wavelength region ranging between blue violet and near UV, and a blue phosphor, a green phosphor and a red phosphor. In this semiconductor light emitting device, $Sr_2P_2O_7:Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, $(Ba, Sr)(Mg, Mn)Al_{10}O_{17}:Eu^{2+}$, $(Sr, Ca, Ba, Mg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr, Ca, Ba)_5(PO_4)_3Cl:Eu^{2+}$, $BaMg_2Al_{16}O_{27}:Eu^{2+}$, $(Ba, Ca)_5(PO_4)_3Cl:Eu^{2+}$, $Ba_3MgSi_2O_8:Eu^{2+}$ or $Sr_3MgSi_2O_8:Eu^{2+}$ is used as the blue phosphor, $(BaMg)Al_{16}O_{27}:Eu^{2+},Mn^{2+}$, $Sr_4Al_{14}O_{25}:Eu^{2+}$, $(SrBa)Al_2Si_2O_8:Eu^{2+}$, $(BaMg)_2SiO_4:Eu^{2+}$, $Y_2SiO_5:Ce^{3+}$, $Tb^{3+}$, $Sr_2P_2O_7$—$Sr_2B_2O_7:Eu^{2+}$, $(BaCaMg)_5(PO_4)_3Cl:Eu^{2+}$, $Sr_2Si_3O_8 2SrCl_2:Eu^{2+}$, $Zr_2SiO_4$—$MgAl_{11}O_{19}:Ce^{3+},Tb^{3+}$, $Ba_2SiO_4:Eu^{2+}$, $Sr_2SiO_4:Eu^{2+}$ or $(BaSr)SiO_4:Eu^{2+}$ is used as the green phosphor, and $Y_2O_2S:Eu^{2+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $Gd_2O_3:Eu^{3+}$, $Gd_2O_2S:Eu^{3+}$ or $Y(P, V)O_4:Eu^{3+}$ is used as the red phosphor.

In this manner, in a conventional semiconductor light emitting device for emitting white-based light, the white-based light is obtained through color mixture of light emitted by a blue-based phosphor, a green-based phosphor and a red-based phosphor or light emitted by a blue-based phosphor and a yellow-based phosphor.

In the conventional semiconductor light emitting device employing the method in which the white-based light is obtained through the color mixture of the light emitted by the blue-based phosphor and the yellow-based phosphor, the aforementioned YAG-based phosphor is used as the yellow-based phosphor. Also, the YAG-based phosphor minimally emits light through excitation by light of a wavelength region exceeding 350 nm and not more than 400 nm, particularly by near UV of a wavelength not more than 360 nm and not less than 400 nm emitted by a near UV LED having a light emitting layer made of a gallium nitride-based compound semiconductor, and highly efficiently emits yellow light through excitation by a blue-based light of a wavelength not less than 400 nm and not more than 530 nm. Therefore, in the conventional semiconductor light emitting device using the YAG-based phosphor, the blue-based phosphor is indispensable for obtaining the white-based light so that a yellow-based phosphor can be excited by blue light emitted by the blue-based phosphor.

Such a semiconductor light emitting device for emitting white-based light is known to be much in demand for light emitting apparatuses such as an illumination apparatus and a display apparatus.

On the other hand, a semiconductor light emitting device composed of a combination of an LED and an inorganic compound phosphor other than the YAG-based phosphor is conventionally known. The aforementioned Japanese Laid-Open Patent Publication No. 2001-143869 describes a semiconductor light emitting device using a $Ba_2SiO_4:Eu^{2+}$, $Sr_2SiO_4:Eu^{2+}$, $Mg_2SiO_4:Eu^{2+}$, $(BaSr)_2SiO_4:Eu^{2+}$ or $(BaMg)_2SiO_4:Eu^{2+}$ silicate phosphor.

However, in the semiconductor light emitting device described in this Japanese Laid-Open Patent Publication No. 2001-143869, any silicate phosphor is applied as a green-based phosphor not as a yellow-based phosphor. Also, it is regarded that an organic LED is more preferably used than an inorganic LED made of an inorganic compound from the viewpoint of luminous efficiency. Specifically, the invention disclosed in this publication does not relate to a semiconductor light emitting device composed of a combination of a near UV LED and blue-based, green-based, yellow-based and red-based phosphors but relates to a semiconductor light emitting device composed of a combination of a near UV LED, and preferably an organic LED, and three kinds of inorganic compounds of blue-based, green-based and red-based phosphors.

According to experiments carried out by the present inventors, the $Sr_2SiO_4:Eu^{2+}$ silicate phosphor described in this Japanese Laid-Open Patent Publication No. 2001-143869 is a phosphor that may have two crystalline phases (that is, the orthorhombic system and the monoclinic system), and at least within a practical range of an $Eu^{2+}$ luminescent center content (=the number of Eu atoms/(the number of Sr atoms+the number of Eu atoms): x) of $0.01 \leq x \leq 0.05$, the orthorhombic $Sr_2SiO_4:Eu^{2+}(\alpha'-Sr_2SiO_4:Eu^{2+})$ is a yellow-based phosphor emitting yellow light having an emission peak in the vicinity of a wavelength of 560 through 575 nm, and the monoclinic $Sr_2SiO_4:Eu^{2+}(\beta-Sr_2SiO_4:Eu^{2+})$ is a green-based phosphor emitting green light having an emission peak in the vicinity of a wavelength of 545 nm. Accordingly, the $Sr_2SiO_4:Eu^{2+}$ green phosphor described in Japanese Laid-Open Patent Publication No. 2001-143869 can be regarded as the monoclinic $Sr_2SiO_4:Eu^{2+}$ phosphor.

At this point, the silicate phosphor will be described. A silicate phosphor represented by a chemical formula, $(Sr_{1-a3-b3-x}Ba_{a3}Ca_{b3}Eu_x)_2SiO_4$ (wherein a3, b3 and x are numerical values satisfying $0 \leq a3 \leq 1$, $0 \leq b3 \leq 1$, $0<x<1$) is conventionally known. This silicate phosphor is a phosphor having been examined as a phosphor for use in a fluorescent lamp, and is known to be a phosphor whose emission peak wavelength is changed in a range approximately not less than 505 nm and not more than 598 nm by changing the composition of Ba—Sr—Ca. Furthermore, it is known to be a phosphor that exhibits comparatively high luminous efficiency in illumination ranging between 170 nm and 350 nm (See J. Electrochemical Soc. Vol. 115, No. 11 (1968) pp. 1181–1184).

This document, however, does not describe that the silicate phosphor exhibits high luminous efficiency through excitation by near UV of a long wavelength region exceeding 350 nm. Therefore, it has not been known that the silicate phosphor is a phosphor that emits yellow-based light of a wavelength not less than 550 nm and less than 600 nm with high efficiency through the excitation by light of the aforementioned near UV wavelength region exceeding 350 nm and not more than 410 nm, and particularly, by near UV of a wavelength in the vicinity of 370 through 390 nm emitted by a near UV LED having a light emitting layer made of a gallium nitride-based compound semiconductor.

In the conventional semiconductor light emitting device and light emitting apparatus composed of a combination of a near UV LED and a phosphor layer including a plurality of phosphors, the semiconductor light emitting device and light emitting apparatus are constructed by employing the method in which white-based light is obtained through the color mixture of light emitted by a blue-based phosphor, a green-based phosphor and a red-based phosphor or light emitted by a blue-based phosphor and a yellow-based phosphor.

It is noted that any of various display apparatuses (such as an LED information display terminal, an LED traffic light, and an LED stop lamp and an LED direction indicator lamp of a vehicle) and various illumination apparatuses (such as an LED indoor or outdoor lighting, a car LED lamp, an LED emergency light and an LED surface emitting light source) is herein widely defined as a light emitting apparatus.

In the conventional semiconductor white-based light emitting device and semiconductor white-based light emitting apparatus composed of the combination of a near UV LED and a phosphor layer including a plurality of phosphors, the luminous flux of the white-based light emitting by the semiconductor light emitting device or the semiconductor light emitting apparatus is low. This is derived from the following: Since a phosphor capable of exhibiting high luminous efficiency through excitation by near UV of a wavelength exceeding 350 nm and not more than 410 nm has not been sufficiently developed, with respect to all of blue-based phosphors, green-based phosphors and red-based phosphors, the number of kinds of phosphors usable in the semiconductor white-based light emitting device or the semiconductor white-based light emitting apparatus is small. Therefore, the number of blue-based, green-based and red-based phosphors exhibiting comparatively high luminous efficiency is limited to be small as well as the shape of an emission spectrum of the resultant white-based light is limited. Furthermore, this is also because the white-based light is obtained through the color mixture of light emitted by the three kinds of blue-based, green-based and red-based phosphors or light emitted by the two kinds of blue-based and yellow-based phosphors.

In order to obtain white-based light with high luminous flux and a large average number of color rendering Ra (of 70 or more) through the color mixture of light emitted by three kinds of blue-based, green-based and red-based phosphors, all of the blue-based phosphor, the green-based phosphor and the red-based phosphor should have high luminous efficiency, and if any one of these phosphors is a phosphor with low luminous efficiency, the luminous flux of the resultant white-based light is lowered because of the color balance of the white-based light.

DISCLOSURE OF THE INVENTION

The present invention was devised to solve these problems, and an object is providing a semiconductor light emitting device and a semiconductor light emitting apparatus for emitting white-based light with high luminous flux and a large Ra and composed of a combination of a near ultraviolet LED and a phosphor layer including a plurality of phosphors.

In order to solve the problems, the semiconductor light emitting device of this invention for emitting white-based light having a luminescent chromaticity point (x, y) in the CIE chromaticity diagram of $0.21 \leq x \leq 0.48$ and $0.19 \leq y \leq 0.45$, includes a combination of a near ultraviolet light emitting diode for emitting light having an emission peak in a wavelength region exceeding 350 nm and less than 410 nm; and a phosphor layer including a plurality of phosphors for absorbing near ultraviolet emitted by the near ultraviolet light emitting diode and for emitting fluorescence having an emission peak in a visible wavelength region not less than 380 nm and not more than 780 nm, and the phosphor layer includes a blue-based phosphor for emitting blue-based fluorescence having an emission peak in a wavelength region not less than 400 mm and less than 500 nm; a green-based phosphor for emitting green-based fluorescence having an emission peak in a wavelength region not less than 500 nm and less than 550 nm; a red-based phosphor for emitting red-based fluorescence having an emission peak in a wavelength region not less than 600 nm and less than 660 nm; and a yellow-based phosphor for emitting yellow-based fluorescence having an emission peak in a wavelength region not less than 550 nm and less than 600 nm.

The near ultraviolet LED is not herein particularly specified as far as it is an LED, including a UV LED, for emitting light having an emission peak in a wavelength region not less than 250 nm and not more than 410 nm. However, from the viewpoint of availability, easiness in fabrication, cost and luminous intensity, a preferably LED is a near UV LED for emitting light having an emission peak in a wavelength region not less than 300 nm and not more than 410 nm, more preferably, it is a near UV LED for emitting light having an emission peak in a wavelength region exceeding 350 nm and not more than 410 nm, and further more preferably, it is a near UV LED for emitting light having an emission peak in a wavelength region exceeding 350 nm and less than 400 nm.

When the above-described phosphor layer is used as a phosphor layer, the semiconductor light emitting device emits light of four colors, that is, blue-based light of a wavelength not less than 400 nm and less than 500 nm, green-based light of a wavelength not less than 500 nm and less than 550 nm, red-based light of a wavelength not less than 600 nm and less than 660 nm, and yellow-based light of a wavelength not less than 55.0 nm and less than 600 nm, so as to emit white-based light through color mixture of these light of four colors. Furthermore, lowering of luminous flux of the white-based light derived from the red-based light, which is good at color purity but is poor at luminosity, is compensated by the yellow-based light with comparatively high luminosity, and therefore, the luminous flux of the white-based light can be improved. Also, since the resultant white-based light attains a spectral distribution with good color balance, an average number of color rendering Ra is also improved.

In the semiconductor light emitting device of the invention, the yellow-based phosphor is preferably a silicate phosphor principally including a compound represented by the following chemical formula:

$(Sr_{1-a1-b1-x}Ba_{a1}Ca_{b1}Eu_x)_2SiO_4$ wherein a1, b1 and x are numerical values satisfying $0 \leq a1 \leq 0.3$, $0 \leq b1 \leq 0.8$, $0<x<1$.

From the viewpoint of the crystal stability against heat of the phosphor, the resistance to temperature extinction, the luminous intensity of the yellow-based light and the color of the light, the numerical values a1, b1 and x in the chemical formula satisfy preferably $0<a1 \leq 0.2$, $0 \leq b1 \leq 0.7$, $0.005 \leq x \leq 0.1$, and more preferably $0<a1 \leq 0.15$, $0 \leq b1 \leq 0.6$, $0.01 \leq x \leq 0.05$.

It is noted that the silicate phosphor is a yellow-based phosphor for emitting yellow-based fluorescence that has an excitation peak in the vicinity of 250 through 300 nm, absorbs light of a wide wavelength range of 100 through 500 nm and has an emission peak in a yellow green, yellow to orange wavelength region of 550 through 600 nm as shown in FIG. 4 for showing examples of the excitation spectrum and the emission spectrum. Accordingly, without using a blue-based phosphor for converting near UV into blue light differently from a YAG-based phosphor, the silicate phosphor emits yellow-based light with comparatively high efficiency through irradiation with near UV emitted by the near UV LED, and therefore is a preferable in the luminous efficiency.

In the case where both a1 and b1 are close to 0, the silicate phosphor tends to have both the orthorhombic system and the monoclinic system, and in the case where these values are larger than the aforementioned range, the crystal field is weak. In either case, the phosphor becomes a greenish phosphor and emits light of poor yellow color purity. Also, in the case where x is smaller than the aforementioned range, the luminous intensity of the silicate phosphor is lowered because the $Eu^{2+}$ luminescence center content is low, and in the case where it is larger, there noticeably arises a problem of temperature extinction in which the luminous intensity is lowered as the ambient temperature increases.

In the semiconductor light emitting device of this invention, the silicate phosphor is preferably a silicate phosphor having an orthorhombic crystal structure and principally including a compound represented by the following chemical formula:

$(Sr_{1-a1-b2-x}Ba_{a1}Ca_{b2}Eu_x)_2SiO_4$ wherein a1, b2 and x are numerical values satisfying $0 \leq a1 \leq 0.3$, $0 \leq b2 \leq 0.6$, $0<x<1$, and from the same viewpoint as that described above, these values satisfy preferably $0<a1 \leq 0.2$, $0 \leq b2 \leq 0.4$, $0.005 \leq x \leq 0.1$ and more preferably $0<a1 \leq 0.15$, $0 \leq b2 \leq 0.3$, $0.01 \leq x \leq 0.05$.

In the semiconductor light emitting device of this invention, the blue-based phosphor is either of the following blue-based phosphors (1) and (2), the green-based phosphor is either of the following green-based phosphors (3) and (4), and the red-based phosphor is the following red-based phosphor (5):

(1) a halophosphate phosphor principally including a compound represented by the following chemical formula:

$(M1_{1-x}Eu_x)_{10}(PO_4)_6Cl_2$, wherein M1 is at least one alkali earth metal element selected from the group consisting of Ba, Sr, Ca and Mg, and x is a numerical value satisfying 0<x<1;

(2) an aluminate phosphor principally including a compound represented by the following chemical formula:

$(M2_{1-x}Eu_x)(M3_{1-y1}Mn_{y1})Al_{10}O_{17}$, wherein M2 is at least one alkali earth metal element selected from the group consisting of Ba, Sr and Ca, M3 is at least one element selected from the group consisting of Mg and Zn, and x and y1 are numerical values satisfying 0<x<1 and 0≦y1<0.05;

(3) an aluminate phosphor principally including a compound represented by the following chemical formula:

$(M2_{1-x}Eu_x)(M3_{1-y2}Mn_{y2})Al_{10}O_{17}$, wherein M2 is at least one alkali earth metal element selected from the group consisting of Ba, Sr and Ca, M3 is at least one element selected from the group consisting of Mg and Zn, and x and y2 are numerical values satisfying 0<x<1 and 0.05≦y2<1;

(4) a silicate phosphor principally including a compound represented by the following chemical formula:

$(M1_{1-x}Eu_x)_2SiO_4$, wherein M1 is at least one alkali earth metal element selected from the group consisting of Ba, Sr, Ca and Mg and x is a numerical value satisfying 0<x<1; and (5) an oxysulfide phosphor principally including a compound represented by the following chemical formula:

$(Ln_{1-x}Eu_x)_2O_2S$, wherein Ln is at least one rare earth element selected from the group consisting of Sc, Y, La and Gd and x is a numerical value satisfying 0<x<1.

All of these blue-based phosphors, green-based phosphors and red-based phosphor are highly efficient phosphors for emitting strong light through excitation by near UV, and therefore, when these phosphors are combined, the phosphor layer can emit white-based light with high luminous intensity.

In the semiconductor light emitting device of this invention, the near ultraviolet light emitting diode preferably includes a light emitting layer made of a gallium nitride-based compound semiconductor.

A near UV LED having a light emitting layer made of a gallium nitride-based compound semiconductor exhibits high luminous efficiency and can be continuously operated for a long period of time. Therefore, when such a near UV LED is used, a semiconductor light emitting device capable of operating for a long period of time and emitting white-based light with high luminous flux can be obtained.

In the semiconductor light emitting device of this invention, the white-based light emitted by the light emitting device preferably has an average number of color rendering Ra not less than 70 and less than 100.

The average number of color rendering Ra is more preferably not less than 80 and less than 100, and further more preferably not less than 88 and less than 100. Thus, the semiconductor light emitting device is particularly suitable to an illumination apparatus.

The first semiconductor light emitting apparatus of this invention includes any of the aforementioned semiconductor light emitting devices.

Since the semiconductor light emitting device emits the white-based light with high luminous flux and a large Ra, when the semiconductor light emitting device of this invention is used for constructing a light emitting apparatus, a semiconductor light emitting apparatus for emitting white light with high luminous flux and a large Ra can be obtained.

The second semiconductor light emitting apparatus of this invention for emitting white-based light having a luminescent chromaticity point (x, y) in the CIE chromaticity diagram of 0.21≦x≦0.48 and 0.19≦y≦0.45, includes a combination of a near ultraviolet light emitting diode for emitting light having an emission peak in a wavelength region exceeding 350 nm and less than 410 nm; and a phosphor layer including a plurality of phosphors for absorbing near ultraviolet emitted by the near ultraviolet light emitting diode and for emitting fluorescence having an emission peak in a visible wavelength region not less than 380 nm and not more than 780 nm, and the phosphor layer includes a blue-based phosphor for emitting blue-based fluorescence having an emission peak in a wavelength region not less than 400 mm and less than 500 nm; a green-based phosphor for emitting green-based fluorescence having an emission peak in a wavelength region not less than 500 nm and less than 550 nm; a red-based phosphor for emitting red-based fluorescence having an emission peak in a wavelength region not less than 600 nm and less than 660 nm; and a yellow-based phosphor for emitting yellow-based fluorescence having an emission peak in a wavelength region not less than 550 nm and less than 600 nm.

Also in this manner, a semiconductor light emitting apparatus for emitting white-based light with high luminous flux and a large Ra can be obtained.

Herein, specific examples of the semiconductor light emitting apparatus are various display apparatuses, such as an LED information display terminal, an LED traffic light, and an LED stop lamp and an LED direction indicator lamp of a vehicle, and various illumination apparatuses, such as an LED indoor or outdoor lighting, a car LED lamp, an LED emergency light and an LED surface emitting light source.

It is goes without saying that when the near UV LED of this invention is replaced with a light emitting device (not limited to a semiconductor light emitting device) for emitting, as a principal light component, light having an emission peak in the same wavelength region, the same functions can be attained and a similar white-based light emitting device can be obtained.

Such a light emitting device can be a laser diode, a surface emitting laser diode, an inorganic electroluminescence element and an organic electroluminescence element.

BEST MODE FOR CARRYING OUT THE INVENTION

Embodiment 1

Figure 1:
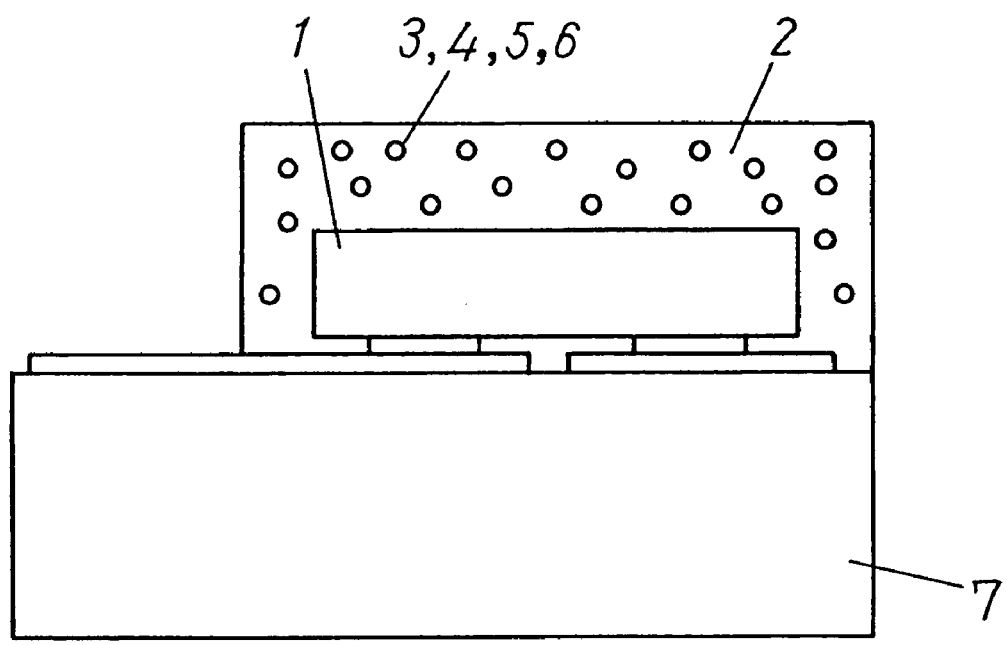
FIG. 1 is a longitudinal cross-sectional view of a semiconductor light emitting device of the invention.
Figure 2:
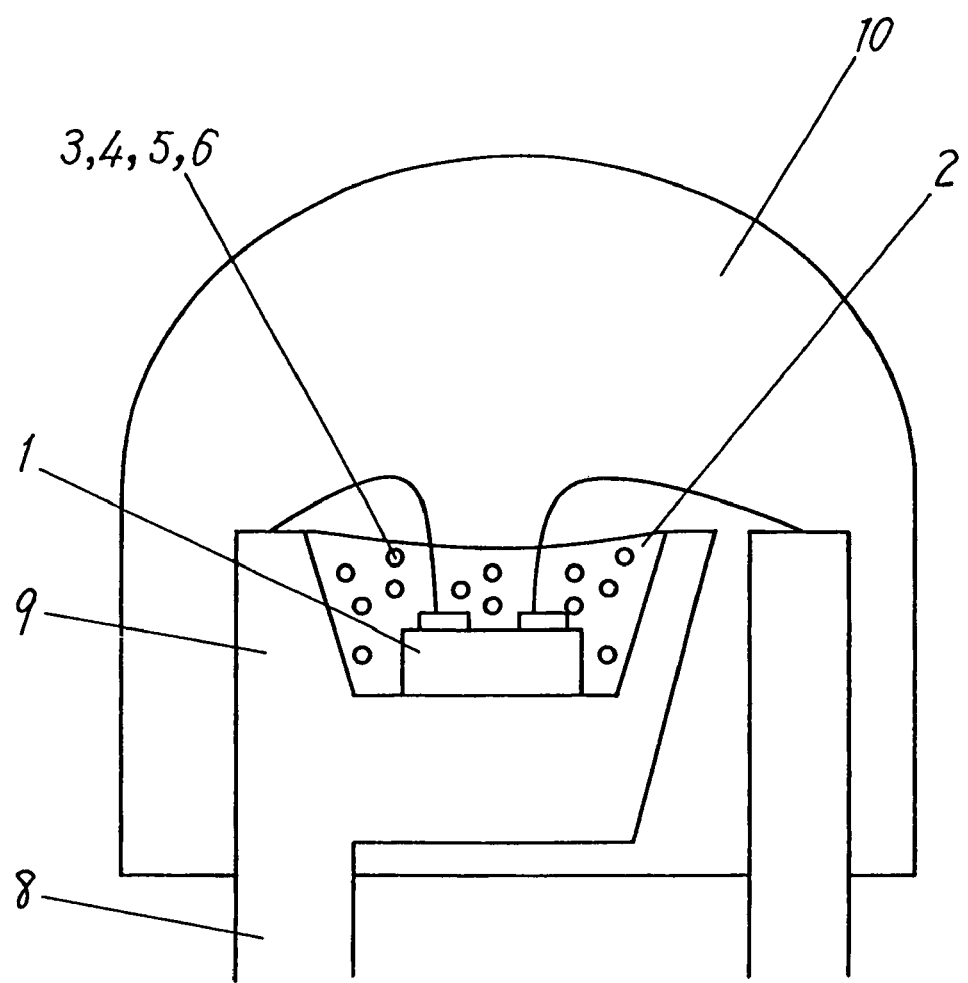
FIG. 2 is a longitudinal cross-sectional view of another semiconductor light emitting device of the invention.
Figure 3:
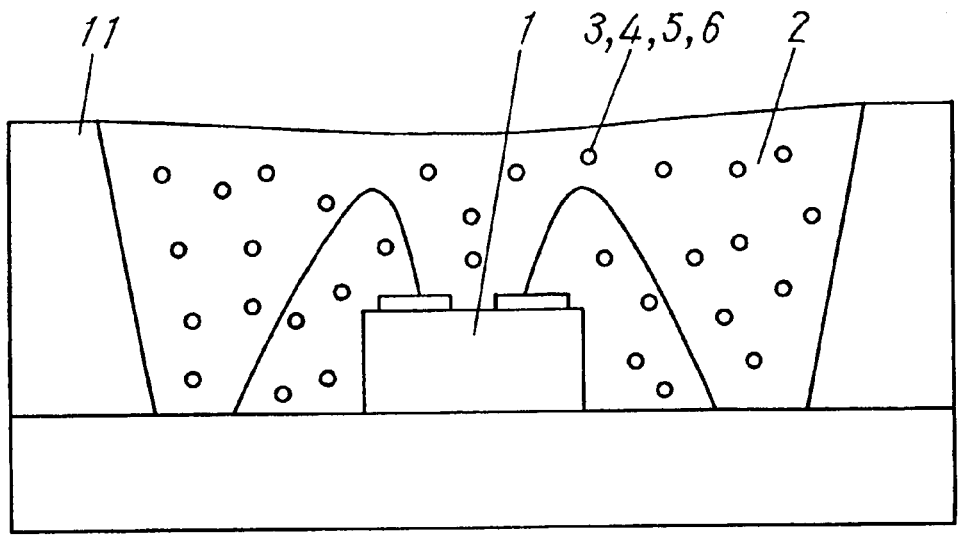
FIG. 3 is a longitudinal cross-sectional view of still another semiconductor light emitting device of the invention.

An embodiment of a semiconductor light emitting device of this invention will now be described with reference to drawings. FIGS. 1 through 3 are longitudinal cross-sectional views of different types of the semiconductor light emitting device.

Typical examples of the semiconductor light emitting device are the semiconductor light emitting devices shown in FIGS. 1, 2 and 3. FIG. 1 shows a semiconductor light emitting device with a structure in which a flip chip type near UV LED 1 is interface mounted on a sub-mount element 7 and the near UV LED 1 is sealed within a resin package containing phosphor particles including blue-based phosphor particles 3, green-based phosphor particles 4, red-based phosphor particles 5 and yellow-based phosphor particles 6 (hereinafter referred to as BGRY phosphor particles) and working also as a phosphor layer. FIG. 2 shows a semiconductor light emitting device with a structure in which a near UV LED 1 is interface mounted on a cup 9 provided on a mount lead of a lead frame 8 and a phosphor layer 2 made of a resin including BGRY phosphor particles (3, 4, 5 and 6) is provided within the cup 9 so as to be wholly sealed within a sealing resin 10. FIG. 3 is a chip type semiconductor light emitting device with a structure in which a near UV LED 1 is provided in a package 11 and a phosphor layer 2 made of a resin including BGRY phosphor particles (3, 4, 5 and 6) is provided in the package 11.

In each of FIGS. 1 through 3, the near UV LED 1 is an LED for emitting near UV having an emission peak in a wavelength region exceeding 350 nm and not more than 410 nm, and preferably exceeding 350 nm and less than 400 nm, and is a photoelectric conversion element (such as what is called an LED, a laser diode, a surface emitting laser diode, an inorganic electroluminescence (EL) element or an organic EL element) having a light emitting layer made of an inorganic compound such as a gallium nitride-based compound semiconductor, a silicon carbide-based compound semiconductor, a zinc selenide-based compound semiconductor or a zinc sulfide-based compound semiconductor, or made of an organic compound. A voltage is applied to or a current is allowed to flow to the near UV LED 1, so as to obtain the near UV having the emission peak in the aforementioned wavelength region.

At this point, in order to stably obtain a large near UV output for a long period of time, the near UV LED 1 is preferably an inorganic LED made of an inorganic compound, and more specifically, is more preferably a near UV LED having a light emitting layer made of a gallium nitride-based compound semiconductor because of its large luminous intensity.

The phosphor layer 2 absorbs the near UV emitted by the near UV LED 1 and converts it into white-based light having a luminescent chromaticity point (x, y) in the CIE chromaticity diagram of $0.21 \leq x \leq 0.48$ and $0.19 \leq y \leq 0.45$, and includes the blue-based phosphor particles 3 for absorbing the near UV emitted by the near UV LED 1 and emitting blue-based fluorescence having an emission peak in a wavelength region not less than 400 nm and less than 500 nm; the green-based phosphor particles 4 for absorbing the near UV emitted by the near UV LED 1 and emitting green-based fluorescence having an emission peak in a wavelength region not less than 500 nm and less than 550 nm; the red-based phosphor particles 5 for absorbing the near UV emitted by the near UV LED 1 and emitting red-based fluorescence having an emission peak in a wavelength region not less than 600 nm and less than 660 nm; and the yellow-based phosphor particles 6 for absorbing the near UV emitted by the near UV LED 1 and emitting yellow-based fluorescence having an emission peak in a wavelength region not less than 550 nm and less than 600 nm.

The phosphor layer 2 is formed by dispersing the BGRY phosphor particles (3, 4, 5 and 6) in a base material. As the base material, a resin such as an epoxy rein, an acrylic resin, a polyimide resin, a urea resin or a silicone resin, can be used, among which an epoxy resin and a silicone resin are preferred because they are easily available, can be easily dealt with and are inexpensive. The substantial thickness of the phosphor layer 2 is not less than 10 μm and not more than 1 mm and preferably not less than 100 μm and not more than 700 μm.

The blue-based phosphor particle 3 included in the phosphor layer 2 can be any blue-based phosphor 3 that absorbs the near UV emitted by the near UV LED 1 and emits blue-based fluorescence having an emission peak in the wavelength region not less than 400 nm and less than 500 nm, and may be made of any of an inorganic material and an organic material (such as a fluorescent dye) and preferably, is either of the following phosphors (1) and (2):

(1) A halophosphate phosphor principally including a compound represented by the following chemical formula: $(M1_{1-x}Eu_x)_{10}(PO_4)_6Cl_2$, wherein M1 is at least one alkali earth metal element selected from the group consisting of Ba, Sr, Ca and Mg, and x is a numerical value satisfying $0<x<1$; and (2) an aluminate phosphor principally including a compound represented by the following chemical formula: $(M2_{1-x}Eu_x)(M3_{1-y1}Mn_{y1})Al_{10}O_{17}$, wherein M2 is at least one alkali earth metal element selected from the group consisting of Ba, Sr and Ca, M3 is at least one element selected from the group consisting of Mg and Zn, and x and y1 are numerical values satisfying $0<x<1$ and $0 \leq y1 < 0.05$.

Specific examples of the preferable blue-based phosphor are $BaMgAl_{10}O_{17}:Eu^{2+}$, $(Ba, Sr)(Mg, Mn)Al_{10}O_{17}:Eu^{2+}$, $(Sr, Ca, Ba, Mg)_{10}(PO_4)_6Cl_2:Eu^{2+}$, $Sr_5(PO_4)_3Cl:Eu^{2+}$, $(Sr, Ca, Ba)_5(PO_4)_3Cl:Eu^{2+}$, $BaMg_2Al_{16}O_{27}:Eu^{2+}$ and $(Ba, Ca)_5(PO_4)_3Cl:Eu^{2+}$.

The green-based phosphor particle 4 included in the phosphor layer 2 can be any green-based phosphor 4 that absorbs the near UV emitted by the near UV LED 1 and emits green-based fluorescence having an emission peak in the wavelength region not less than 500 nm and less than 550 nm, and may be made of any of an inorganic material and an organic material and preferably, is either of the following phosphors (3) and (4):

(3) An aluminate phosphor principally including a compound represented by the following chemical formula: $(M2_{1-x}Eu_x)(M3_{1-y2}Mn_{y2})Al_{10}O_7$, wherein M2 is at least one alkali earth metal element selected from the group consisting of Ba, Sr and Ca, M3 is at least one element selected from the group consisting of Mg and Zn, and x and y2 are numerical values satisfying $0<x<1$ and $0.05 \leq y2<1$; and (4) a silicate phosphor principally including a compound represented by the following chemical formula: $(M1_{1-x}Eu_x)_2SiO_4$, wherein M1 is at least one alkali earth metal element selected from the group consisting of Ba, Sr, Ca and Mg and x is a numerical value satisfying $0<x<1$.

Specific examples of the preferred green-based phosphor are $(BaMg)Al_{16}O_{27}:Eu^{2+},Mn^{2+}$, $(BaMg)_2SiO_4:Eu^{2+}$, $Ba_2SiO_4:Eu^{2+}$, $Sr_2SiO_4:Eu^{2+}$, $(BaSr)SiO_4:Eu^{2+}$ and $(Ba, Sr)SiO_4:Eu^{2+}$.

The red-based phosphor particle 5 included in the phosphor layer 2 can be any red-based phosphor 5 that absorbs the near UV emitted by the near UV LED 1 and emits red-based fluorescence having an emission peak in the wavelength region not less than 600 nm and less than 660 nm, and may be made of any of an inorganic material and an organic material and preferably, is the following phosphor (5):

(5) An oxysulfide phosphor principally including a compound represented by the following chemical formula: $(Ln_{1-x}Eu_x)_2O_2S$, wherein Ln is at least one rare earth element selected from the group consisting of Sc, Y, La and Gd and x is a numerical value satisfying $0<x<1$.

Specific examples of the preferred red-based phosphor 5 are $Sc_2O_2S:Eu^{3+}$; $Y_2O_2S:Eu^{3+}$; $La_2O_2S:Eu^{3+}$; $La_2O_2S:Eu^{3+}$, $Sm^{3+}$ and $Gd_2O_2S:Eu^{3+}$.

The yellow-based phosphor particle 6 included in the phosphor layer 2 can be any yellow-based phosphor that absorbs the near UV emitted by the near UV LED 1 and emits yellow-based fluorescence having an emission peak in the wavelength region not less than 550 nm and less than 600 nm, and preferably, is a silicate phosphor principally including a compound represented by the following chemical formula because of its easiness in the fabrication and good luminous performances (such as high luminance and high yellow color purity):

$(Sr_{1-a1-b1-x}Ba_{a1}Ca_{b1}Eu_x)_2SiO_4$, wherein a1, b1 and x are numerical values satisfying $0 \leq a1 \leq 0.3$, $0 \leq b1 \leq 0.8$, $0<x<1$, preferably $0<a1 \leq 0.2$, $0 \leq b1 \leq 0.7$ and $0.005 \leq x \leq 0.1$, and more preferably $0<a1 \leq 0.15$, $0 \leq b1 \leq 0.6$ and $0.01 \leq x \leq 0.05$.

More preferably, the yellow phosphor is a silicate phosphor principally including a compound represented by the following chemical formula:

$(Sr_{1-a1-b2-x}Ba_{a1}Ca_{b2}Eu_x)_2SiO_4$, wherein a1, b2 and x are numerical values satisfying $0 \leq a1 \leq 0.3$, $0 \leq b2 \leq 0.6$ and $0<x<1$.

The crystal structure of a silicate phosphor can be either the orthorhombic system or the monoclinic system, and in the semiconductor light emitting device of this invention, the crystal structure of the silicate phosphor may be either of the orthorhombic system and the monoclinic system, and any of the following silicate phosphors (a) and (b) can be used:

(a) A silicate phosphor having the orthorhombic crystal structure with the following composition:

$(Sr_{1-a1-b2-x}Ba_{a1}Ca_{b2}Eu_x)_2SiO_4$, wherein a1, b2 and x are numerical values satisfying $0 \leq a1 \leq 0.3$, $0 \leq b2 \leq 0.6$ and $0<x<1$, preferably $0<a1 \leq 0.2$, $0 \leq b2 \leq 0.4$ and $0.005 \leq x \leq 0.1$ and more preferably $0<a1 \leq 0.15$, $0 \leq b2 \leq 0.3$ and $0.01 \leq x \leq 0.05$; and (b) a silicate phosphor having the monoclinic crystal structure with the following composition:

$(Sr_{1-a2-b1-x}Ba_{a2}Ca_{b1}Eu_x)_2SiO_4$, wherein a2, b1 and x are numerical values satisfying $0 \leq a2 \leq 0.2$, $0 \leq b1 \leq 0.8$ and $0<x<1$, preferably $0 \leq a2 \leq 0.15$, $0<b1 \leq 0.7$ and $0.005 \leq x \leq 0.1$ and more preferably $0 \leq a2 \leq 0.1$, $0<b1 \leq 0.6$ and $0.01 \leq x \leq 0.05$.

In a composition in which the numerical values a1, a2, b1 and b2 are smaller than the aforementioned ranges in the respective chemical formulas, the crystal structure of the resultant silicate phosphor tends to be unstable, and the luminous characteristic is disadvantageously varied depending upon the operation temperature. On the other hand, in a composition in which the numerical values are larger than the ranges, emitted light is too greenish to work as a good yellow-based phosphor and hence the resultant phosphor is a green-based phosphor, and therefore, even when it is combined with the red-based, green-based and blue-based phosphors, a semiconductor light emitting device for emitting white-based light with high luminous flux and a large Ra cannot be obtained. Also, in a composition in which the Eu content x is smaller than the aforementioned range, the luminous intensity is small, and in a composition in which the content x is larger, there noticeably arises a problem of temperature extinction in which the luminous intensity is lowered as the ambient temperature increases.

The yellow-based phosphor used in the semiconductor light emitting device of this invention is preferably the silicate phosphor having the orthorhombic crystal structure because such a silicate phosphor emits yellow-based light with high color purity. Furthermore, in order to stabilize the crystal structure of the silicate phosphor or increase the luminous intensity, Mg or Zn may be substituted for part of Sr, Ba or Ca.

In the silicate phosphor, the center grain size obtained through evaluation of a grain size distribution performed by using a laser diffracted scatter grain size distribution analyzer (for example, LMS-30; manufactured by Seishin Enterprise Co., Ltd.) may be not less than 0.1 μm and not more than 100 μm, and in consideration of easiness in synthesis of the phosphor, availability and easiness in forming the phosphor layer, the center grain size is preferably not less than 1 μm and not more than 20 μm and more preferably not less than 2 μm and not more than 10 μm. The silicate phosphor may have a grain size distribution excluding particles smaller than 0.01 μm and exceeding 1000 μm, and for the same reason as that described with respect to the center grain size, the silicate phosphor preferably has a distribution approximate to a normal distribution in a range not less than 1 μm and not more than 50 μm.

The silicate phosphor can be prepared by a synthesis method described in, for example, the above-described document (J. Electrochemical Soc. Vol. 115, No. 11 (1968) pp. 1181–1184).

Now, the characteristic of the silicate phosphor will be described more specifically.

Figure 4:
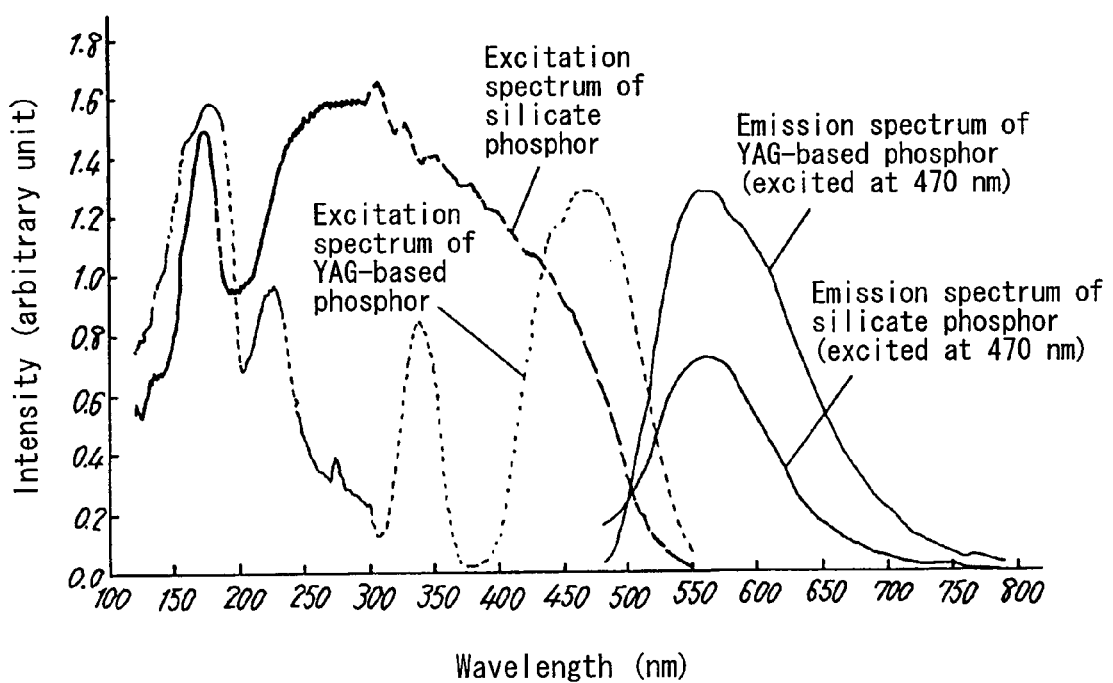
FIG. 4 is a diagram for showing emission and excitation spectra of a silicate phosphor and a YAG-based phosphor.

FIG. 4 is a diagram for showing examples of excitation and emission spectra of the silicate phosphor. In FIG. 4, examples of excitation and emission spectra of the conventional YAG-based phosphor are also shown for comparison.

As is understood also from FIG. 4, the YAG-based phosphor is a phosphor that has excitation peaks in three positions respectively in the vicinity of 100 nm through 300 nm, 300 nm through 370 nm, and 370 nm through 550 nm, and absorbs light of these narrow wavelength regions and emits yellow-based fluorescence having an emission peak in a yellow green to yellow wavelength region of 550 through 580 nm. On the other hand, the silicate phosphor used in this invention is a yellow-based phosphor that has an excitation peak in the vicinity of 250 through 300 nm, and absorbs light of a wide wavelength region of 100 through 500 nm and emits yellow-based fluorescence having an emission peak in a yellow green, yellow to orange wavelength region of 550 through 600 nm. Furthermore, through excitation by near UV of a wavelength exceeding 350 nm and less than 400 nm, this silicate phosphor attains luminous efficiency much higher than that of the YAG-based phosphor.

Accordingly, when the silicate phosphor is included in the phosphor layer 2 as the yellow-based phosphor particles 6, the phosphor layer 2 emits strong yellow-based light.

It is noted that any silicate phosphor having a composition in which the numerical values a1, a2, b1, b2 and x are within the aforementioned ranges has excitation and emission spectra similar to those of the silicate phosphor exemplified in FIG. 4.

Embodiment 2

Figure 5:
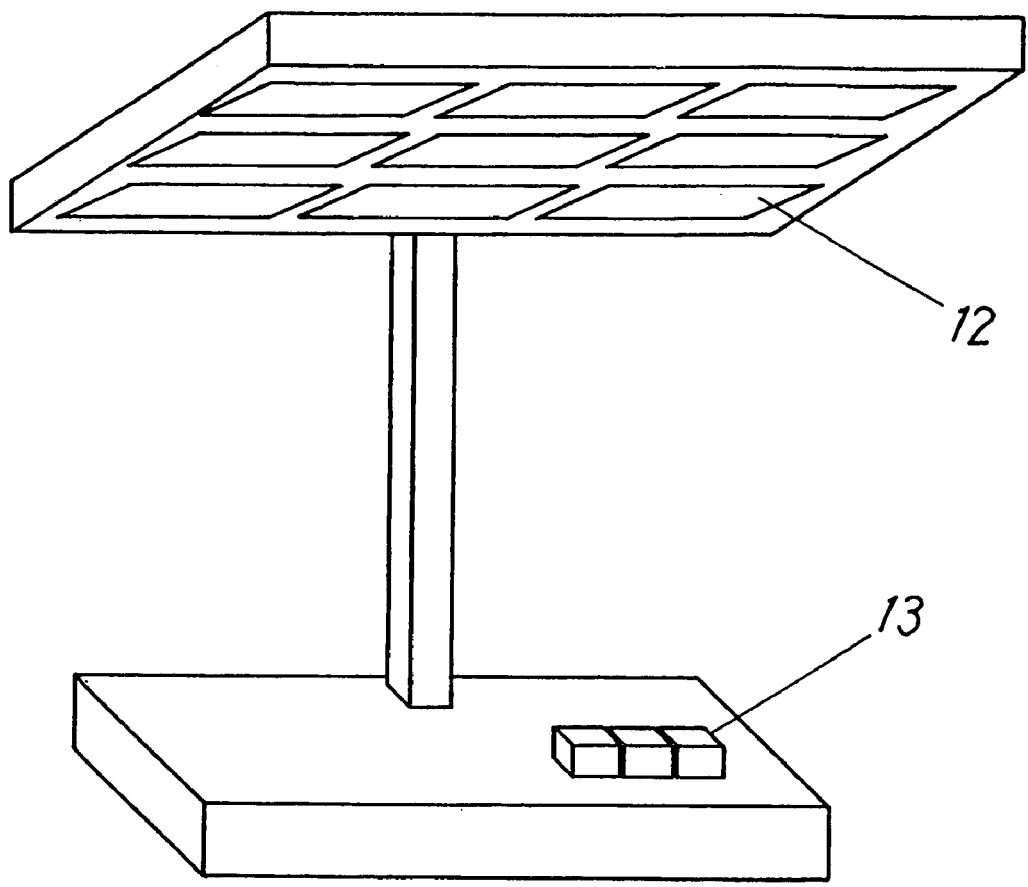
FIG. 5 is a diagram for showing an illumination apparatus as an example of a semiconductor light emitting apparatus of the invention.
Figure 6:
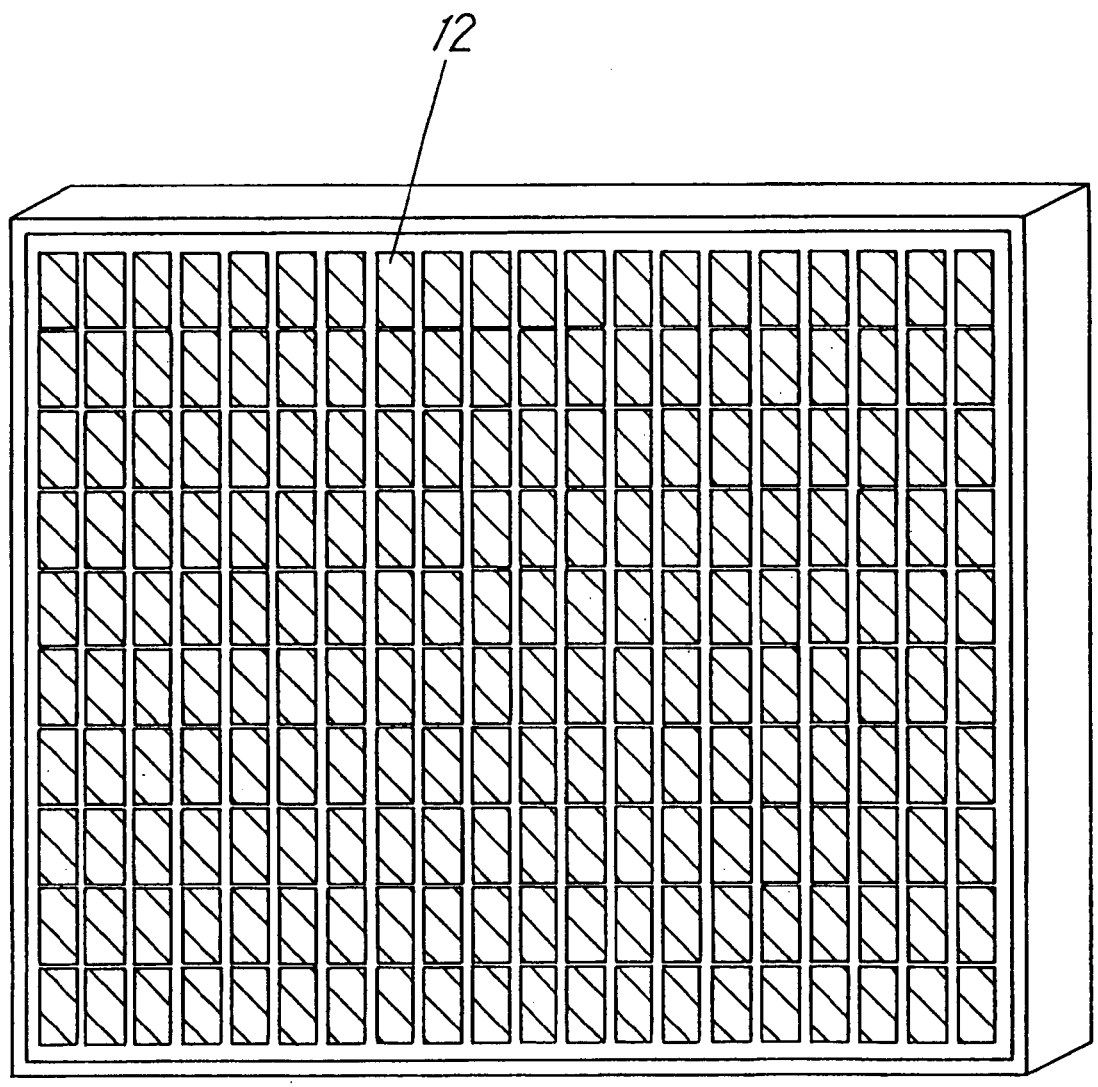
FIG. 6 is a diagram for showing an image display apparatus as another example of the semiconductor light emitting apparatus of the invention.
Figure 7:
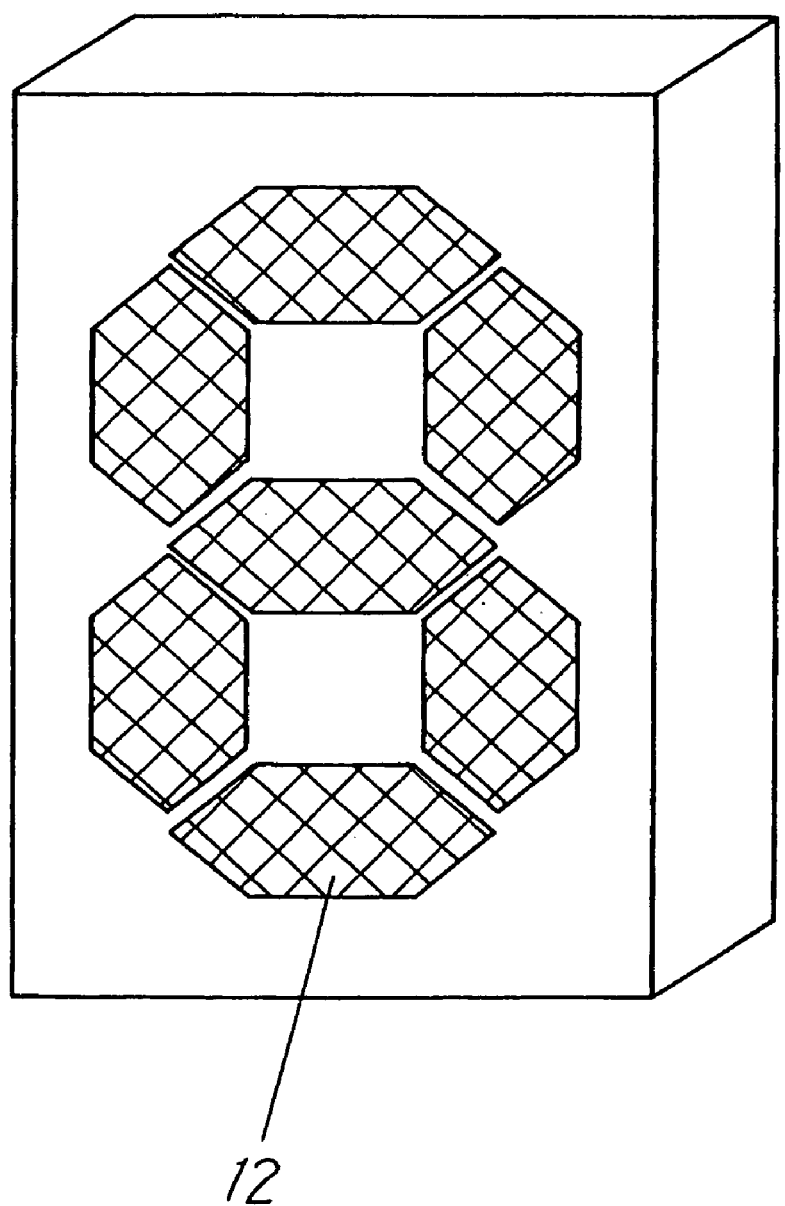
FIG. 7 is a diagram for showing a numerical indicator apparatus as still another example of the semiconductor light emitting apparatus of the invention.

An embodiment of a semiconductor light emitting apparatus according to this invention will now be described with reference to drawings. FIGS. 5 through 7 are diagrams of examples of the semiconductor light emitting apparatus of this invention.

FIG. 5 shows a desk type illumination apparatus using the semiconductor light emitting device of this invention, FIG. 6 shows a display apparatus for image display using the semiconductor light emitting device of this invention, and FIG. 7 shows a display apparatus for numerical indication using the semiconductor light emitting device of this invention.

In each of FIGS. 5 through 7, a semiconductor light emitting device 12 is the semiconductor light emitting device according to the invention described in Embodiment 1.

In FIG. 5, a reference numeral 13 denotes a switch for lighting the semiconductor light emitting device 12, and when the switch 13 is turned on, the semiconductor light emitting device 12 is supplied with power for emitting light.

The illumination apparatus of FIG. 5 is shown merely as a preferred example and does not limit the semiconductor light emitting apparatus of this invention. Also, the color of emitted light, the size, the number and the shape of a light emitting portion of the semiconductor light emitting device 12 are not particularly specified.

In this exemplified illumination apparatus, a preferable color temperature is not less than 2000 K and not more than 12000 K, preferably not less than 3000 K and not more than 10000 K and more preferably not less than 3500 K and not more than 8000 K, but these color temperatures do not limit the illumination apparatus embodying the semiconductor light emitting apparatus of this invention.

FIGS. 6 and 7 show the image display apparatus and the numerical indicator apparatus as examples of a display apparatus embodying the semiconductor light emitting apparatus of this invention, but the semiconductor light emitting apparatus of this invention is not limited to these display apparatuses.

A display apparatus exemplifying the semiconductor light emitting apparatus uses the semiconductor light emitting device 12 described in Embodiment 1 similarly to the illumination apparatus. Also, the color of emitted light, the size, the number, the shape of a light emitting portion of each semiconductor light emitting device 12 and the arrangement of the semiconductor light emitting devices are not particularly specified, and the appearance is not particularly specified.

With respect to the dimension of the image display apparatus, the image display apparatus can be fabricated in an arbitrary dimension of a width not less than 1 cm and not more than 10 m, a height not less than 1 cm and not more than 10 m and a depth not less than 5 mm and not more than 5 m, and the number of semiconductor light emitting devices to be used can be set in accordance with the dimension.

In the numerical indicator apparatus shown in FIG. 7, a reference numeral 12 denotes the semiconductor light emitting device described in Embodiment 1. Also in this numerical indicator apparatus, the color of emitted light, the size, the number and the shape of a pixel are not particularly specified as in the image display apparatus. Also, a letter to be indicated is not limited to a numeric character but may be a kanji, a katakana, an alphabet, a Greek letter or the like.

In the semiconductor light emitting apparatuses shown in FIGS. 5 through 7, when each light emitting apparatus uses a plurality of semiconductor light emitting devices 12 using one kind of LED chip, respective semiconductor light emitting devices can be operated by using the same driving voltage or injected current, the variations in the characteristics of the light emitting devices derived from external factors such as the ambient temperature can be substantially the same, the rate of change of the luminous intensity or the color tone of the light emitting devices against voltage change or temperature change can be suppressed, and the circuit configuration of the light emitting apparatus can be simplified.

Also, when the semiconductor light emitting apparatus uses a semiconductor light emitting device with a flat pixel surface, a light emitting apparatus with a flat light emitting surface, such as a display apparatus with a flat display surface or a surface emitting illumination apparatus, can be provided, and thus, an image display apparatus with good picture quality or an illumination apparatus with a good design property can be provided.

The semiconductor light emitting apparatus of this invention uses the semiconductor light emitting device described in Embodiment 1 for obtaining white-based light with high luminous flux, and therefore, the light emitting apparatus can attain high luminous flux.

It is noted that the semiconductor light emitting apparatus of this invention is not limited to a light emitting apparatus using the semiconductor light emitting device described in Embodiment 1 but may be a semiconductor light emitting apparatus composed of a combination of the above-described near UV light emitting diode and the above-described phosphor layer. Needless to say, the same effects can be attained and a similar semiconductor light emitting apparatus can be obtained in this manner.

Example 1

A semiconductor light emitting device was fabricated by using, as a blue-based phosphor, one represented by a chemical formula, $(M2_{1-x}Eu_x)(M3_{1-y1}Mn_{y1})Al_{10}O_{17}$ (wherein M2 is at least one alkali earth metal element selected from the group consisting of Ba, Sr and Ca, M3 is at least one element selected from the group consisting of Mg and Zn, and x and y1 are numerical values satisfying $0<x<1$ and $0.1 \leq y1 < 0.5$), and specifically, a $(Ba,Sr)MgAl_{10}O_{17}:Eu^{2+},Mn^{2+}$ aluminate blue phosphor (wherein M2=0.9 Ba+0.1Sr, x=0.1 and y=0.015); as a green-based phosphor, one represented by a chemical formula, $(M2_{1-x}Eu_x)(M3_{1-y2}Mn_{y2})Al_{10}O_{17}$ (wherein M2 is at least one alkali earth metal element selected from the group consisting of Ba, Sr and Ca, M3 is at least one element selected from the group consisting of Mg and Zn, and x and y2 are numerical values satisfying $0<x<1$ and $0.05 \leq y2<1$), and specifically, a $BaMgAl_{10}O_{17}:Eu^{2+},Mn^{2+}$ aluminate green phosphor (wherein x=0.1 and y=0.3); as a red-based phosphor, one represented by a chemical formula, $(Ln_{1-x}Eu_x)_2O_2S$ (wherein Ln is at least one rare earth element selected from the group consisting of Sc, Y, La and Gd, and x is a numerical value satisfying $0<x<1$), and specifically, a $La_2O_2S:Eu^{3+}$ oxysulfide red phosphor (wherein x=0.1); and as a yellow-based phosphor, one represented by a chemical formula, $(Sr_{1-a1-b1-x}Ba_{a1}Ca_{b1}Eu_x)_2SiO_4$ (wherein a1, b1 and x are numerical values satisfying $0 \leq a1 \leq 0.3$, $0 \leq b1 \leq 0.8$, and $0<x<1$) and having an orthorhombic crystal structure, and specifically, a $(Sr, Ba)_2SiO_4:Eu^{2+}$ silicate yellow phosphor (wherein a1=0.1, b1=0 and x=0.02).

The semiconductor light emitting device had the structure as shown in FIG. 2 in which a near UV LED is interface mounted on a cup provided on a mount lead and a phosphor layer made of an epoxy resin containing BGRY phosphor particles is formed within the cup. The near UV LED was an InGaN-based near UV LED having a light emitting layer made of a gallium nitride-based compound semiconductor and having an emission peak at a wavelength of 380 nm. Emission spectra of the phosphors, namely, the blue phosphor, the green phosphor, the red phosphor and the silicate yellow phosphor, obtained through excitation by near UV of a wavelength of 380 nm emitted by this near UV LED are shown in FIGS. 15(a), 15(d), 15(f) and 15(g).

In the semiconductor light emitting device, the mixing weight ratio among the blue phosphor, the green phosphor, the red phosphor and the silicate yellow phosphor was 55:14:42:24, the weight ratio between the epoxy resin and these phosphors (mixed phosphor) was 20:80, and the phosphor layer had a substantial thickness of approximately 600 µm.

For comparison, a semiconductor light emitting device (of Comparative Example 1) including, in its phosphor layer, the blue phosphor, the green phosphor and the red phosphor the same as those used in example 1 and excluding a yellow-based phosphor was fabricated. In this semiconductor light emitting device of Comparative Example 1, the mixing weight ratio among the blue phosphor, the green phosphor and the red phosphor was 29:26:52, and the weight ratio between the epoxy resin and the mixed phosphor and the substantial thickness of the phosphor layer were the same as those employed in the semiconductor light emitting device of Example 1.

Figure 8:
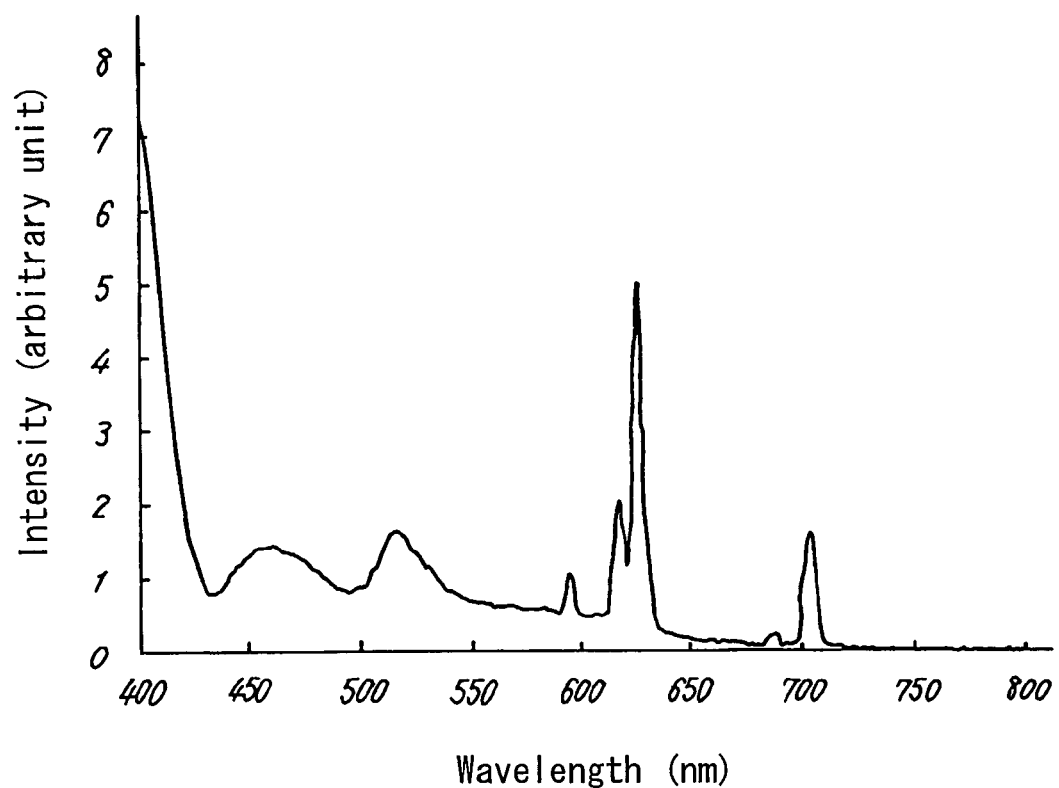
FIG. 8 is a diagram for showing an emission spectrum of a semiconductor light emitting device of Example 1.
Figure 9:
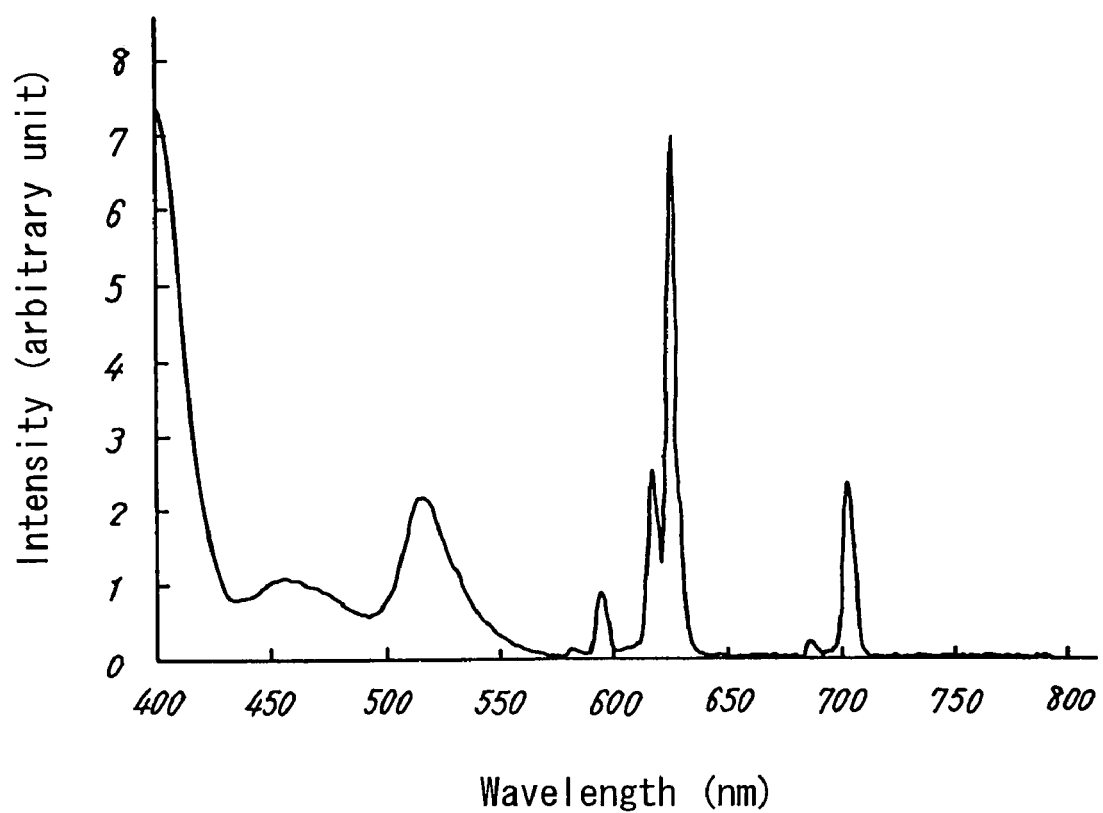
FIG. 9 is a diagram for showing an emission spectrum of a semiconductor light emitting device of Comparative Example 1.

A current of 10 mA was supplied to the near UV LED of each of the semiconductor light emitting devices of Example 1 and Comparative Example 1, and thus, the near UV LED was operated so as to obtain white-based light from the semiconductor light emitting device. The color temperature, the Duv, the (x, y) values in the CIE chromaticity diagram, the Ra and the relative value of luminous flux of the white-based light were evaluated by using an instantaneous multi photometric system (MCPD-7000; manufactured by Otsuka Electronics Co., Ltd.). The results are listed in Table 1. Furthermore, the emission spectra of the white-based light emitted by the semiconductor light emitting devices of Example 1 and Comparative Example 1 are shown in FIGS. 8 and 9. As is understood from Table 1, in obtaining the white-based light with substantially the same color temperature (of 7880 through 9500 K), substantially the same Duv (of −15.6 through −8.7) and substantially the same chromaticity (of x=0.290 through 0.301 and y=0.278 through 0.293), the semiconductor light emitting device of Example 1 according to this invention attained higher luminous flux (of approximately 125%) and a larger Ra (of 68).

TABLE 1

|  | Color temperature (K) | Duv | x | y | Ra | Relative luminous flux |
| --- | --- | --- | --- | --- | --- | --- |
| Example 1 | 8540 | −12.3 | 0.297 | 0.284 | 68 | 1803 |
| Com. Ex. 1 | 9500 | −11.3 | 0.290 | 0.278 | 31 | 1470 |

Example 2

Figure 15A:
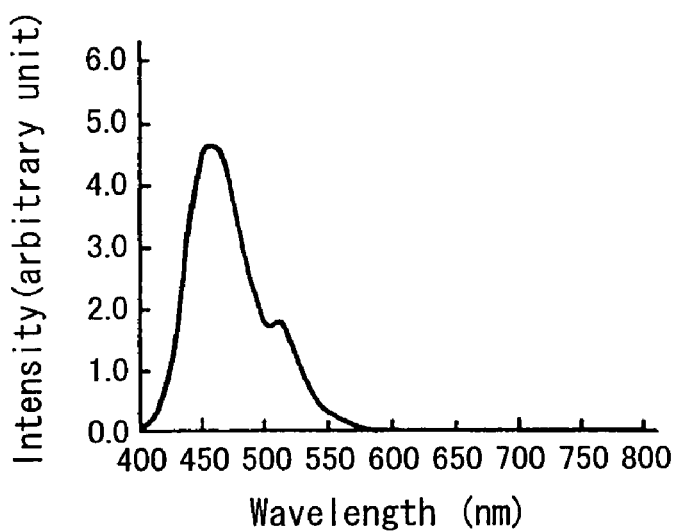
FIG. 15 is a diagram for showing emission spectra of phosphors used in the invention.
Figure 15B:
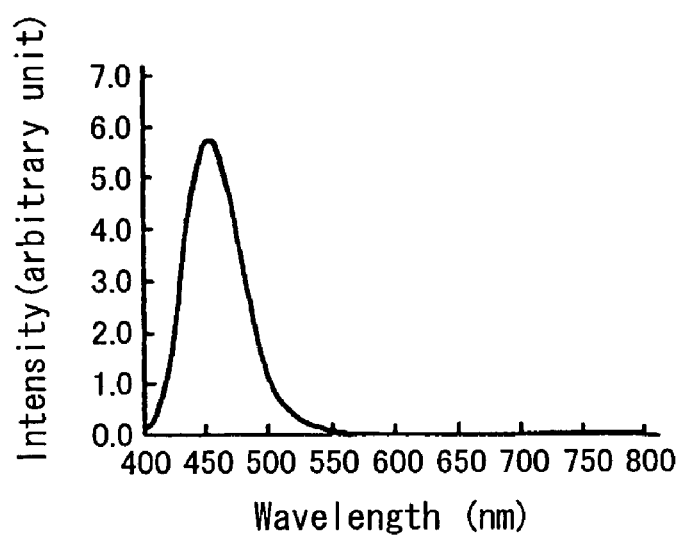
Figure 15C:
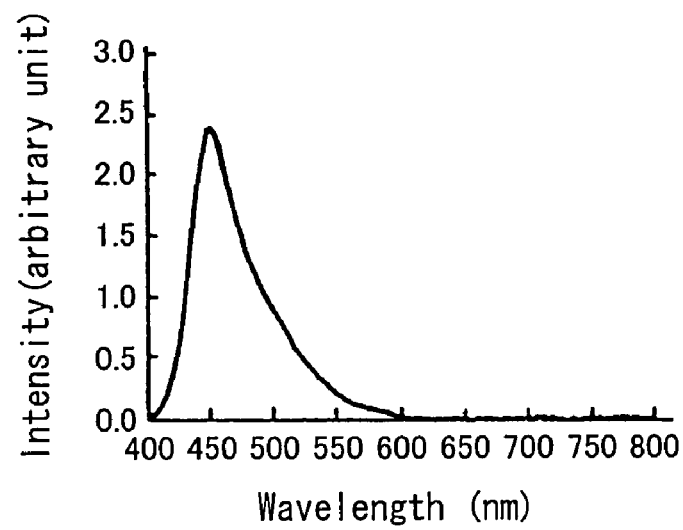
Figure 15D:
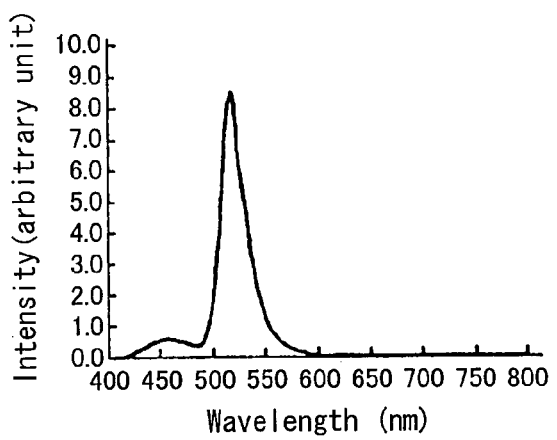
Figure 15E:
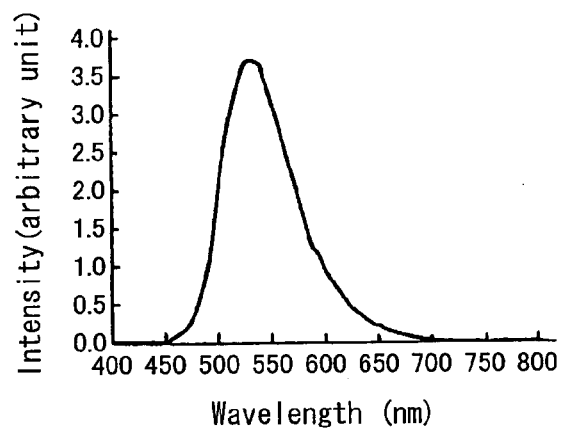
Figure 15F:
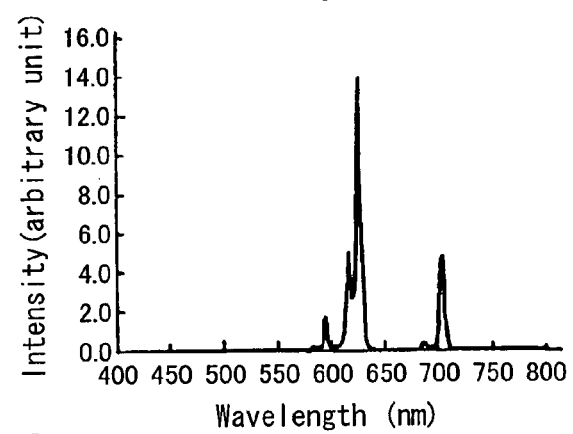
Figure 15G:
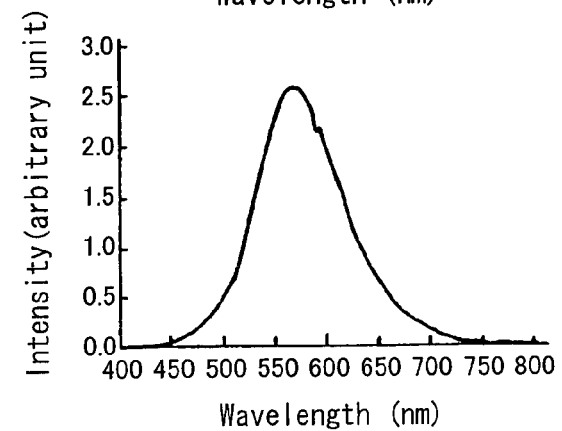

A semiconductor light emitting device (of Example 2) was fabricated in the same manner as in Example 1 except that a green-based phosphor represented by a chemical formula $(M1_{1-x}Eu_x)_2SiO_4$ (wherein M1 is at least one alkali earth metal element selected from the group consisting of Ba, Sr, Ca and Mg, and x is a numerical value satisfying $0<x<1$), and specifically, a $(Ba, Sr)_2SiO_4:Eu^{2+}$ silicate green phosphor (wherein M1=0.4Ba+0.6Sr and x=0.02) was used as the green phosphor and that the mixing weight ratio among the blue phosphor, the green phosphor, the red phosphor and the silicate yellow phosphor was 92:3:33:48. An emission spectrum of the $(Ba, Sr)_2SiO_4:Eu^{2+}$ silicate green phosphor obtained through the excitation by near UV of a wavelength of 380 nm is shown in FIG. 15(e).

For comparison, a semiconductor light emitting device (of Comparative Example 2) using the same green-based phosphor as that of Example 2 and excluding a yellow phosphor in its phosphor layer was fabricated. In the semiconductor light emitting device of Comparative Example 2, the mixing weight ratio among the blue phosphor, the green phosphor and the red phosphor was 50:29:64.

Figure 10:
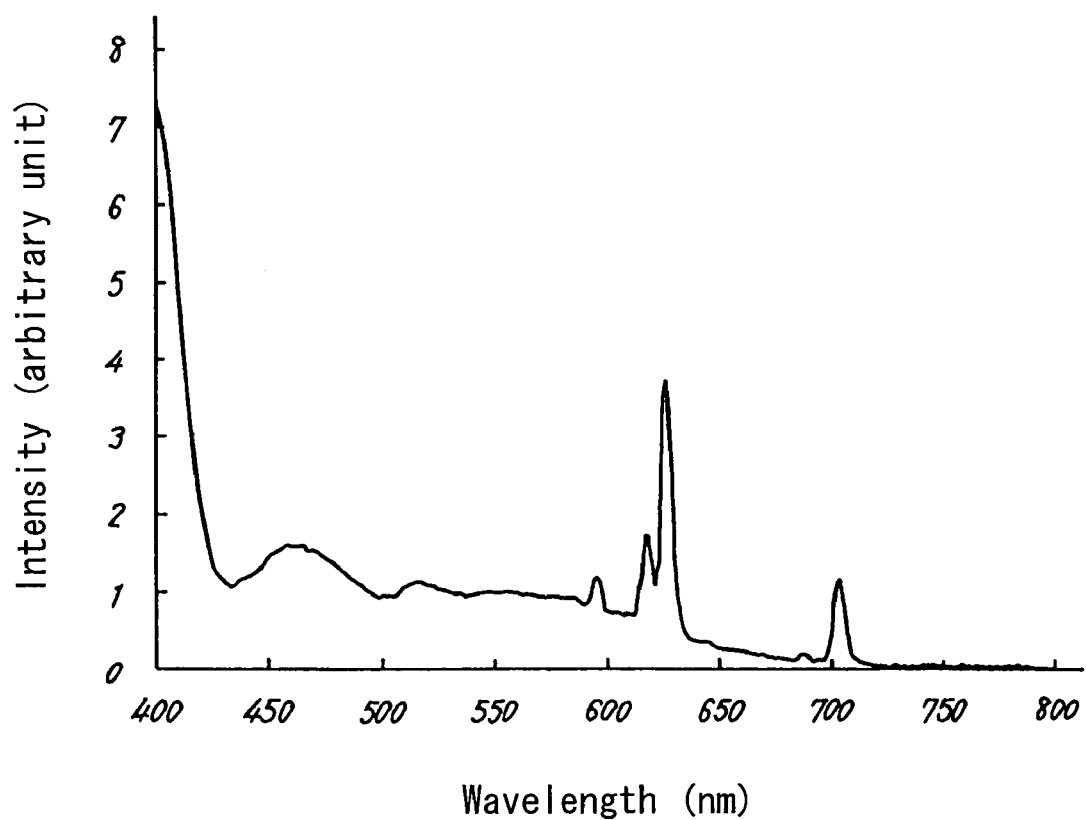
FIG. 10 is a diagram for showing an emission spectrum of a semiconductor light emitting device of Example 2.
Figure 11:
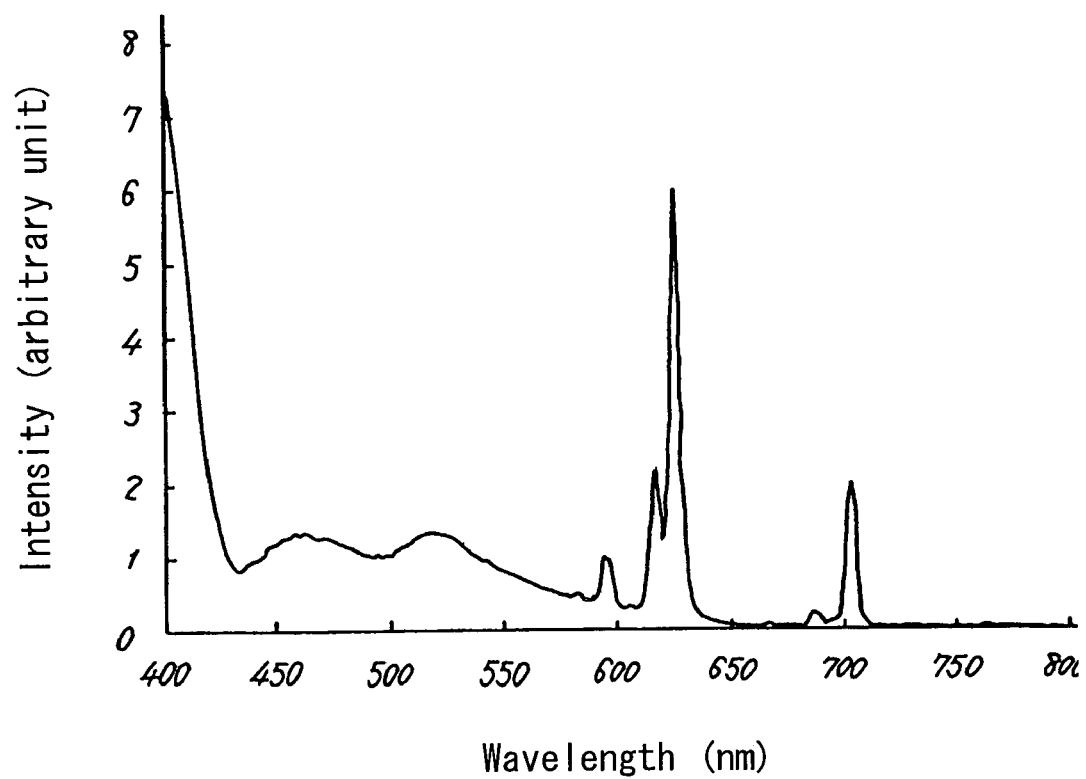
FIG. 11 is a diagram for showing an emission spectrum of a semiconductor light emitting device of Comparative Example 2.

In the same manner as in Example 1, the color temperature, the Duv, the (x, y) values in the CIE chromaticity diagram, the Ra and the relative value of the luminous flux of the white-based light obtained by operating the near UV LED of each of the semiconductor light emitting devices were evaluated. The results are listed in Table 2. Furthermore, the emission spectra of the white-based light emitted by the semiconductor light emitting devices of Example 2 and Comparative Example 2 are shown in FIGS. 10 and 11. As is understood from Table 2, in obtaining the white-based light having substantially the same color temperature (of 7880 through 9500 K), substantially the same Duv (of −15.6 through −8.7) and substantially the same chromaticity (of x=0.290 through 0.301 and y=0.278 through 0.293), the semiconductor light emitting device of Example 2 according to this invention attained higher luminous flux (of approximately 113%) and a larger Ra (of 86). Also as compared with the semiconductor light emitting device of Example 1, higher luminous flux and a larger Ra were attained.

TABLE 2

|  | Color temperature (K) | Duv | x | y | Ra | Relative luminous flux |
| --- | --- | --- | --- | --- | --- | --- |
| Example 2 | 8360 | −15.6 | 0.300 | 0.282 | 86 | 2040 |
| Com. Ex. 2 | 8630 | −8.7 | 0.294 | 0.288 | 66 | 1810 |

Example 3

A semiconductor light emitting device (of Example 3) was fabricated in the same manner as in Example 1 except that a blue-based phosphor represented by a chemical formula, $(M2_{1-x}Eu_x)(M3_{1-y1}Mn_{y1})Al_{10}O_{17}$ (wherein M2 is at least one alkali earth metal element selected from the group consisting of Ba, Sr and Ca, M3 is at least one element selected from the group consisting of Mg and Zn, and x and y1 are numerical values satisfying $0<x<1$ and $0 \leq y1<0.05$), and specifically, a $BaMgAl_{10}O_{17}:Eu^{2+}$ aluminate blue phosphor (wherein $x=0.1$ and $y=0$; a second aluminate blue phosphor) was used as the blue phosphor and the mixing weight ratio among the blue phosphor, the green phosphor, the red phosphor and the yellow phosphor was 112:12:20:77. An emission spectrum of the $BaMgAl_{10}O_{17}:Eu^{2+}$ aluminate blue phosphor obtained through the excitation by near UV of a wavelength of 380 nm is shown in FIG. 15(b).

Figure 12:
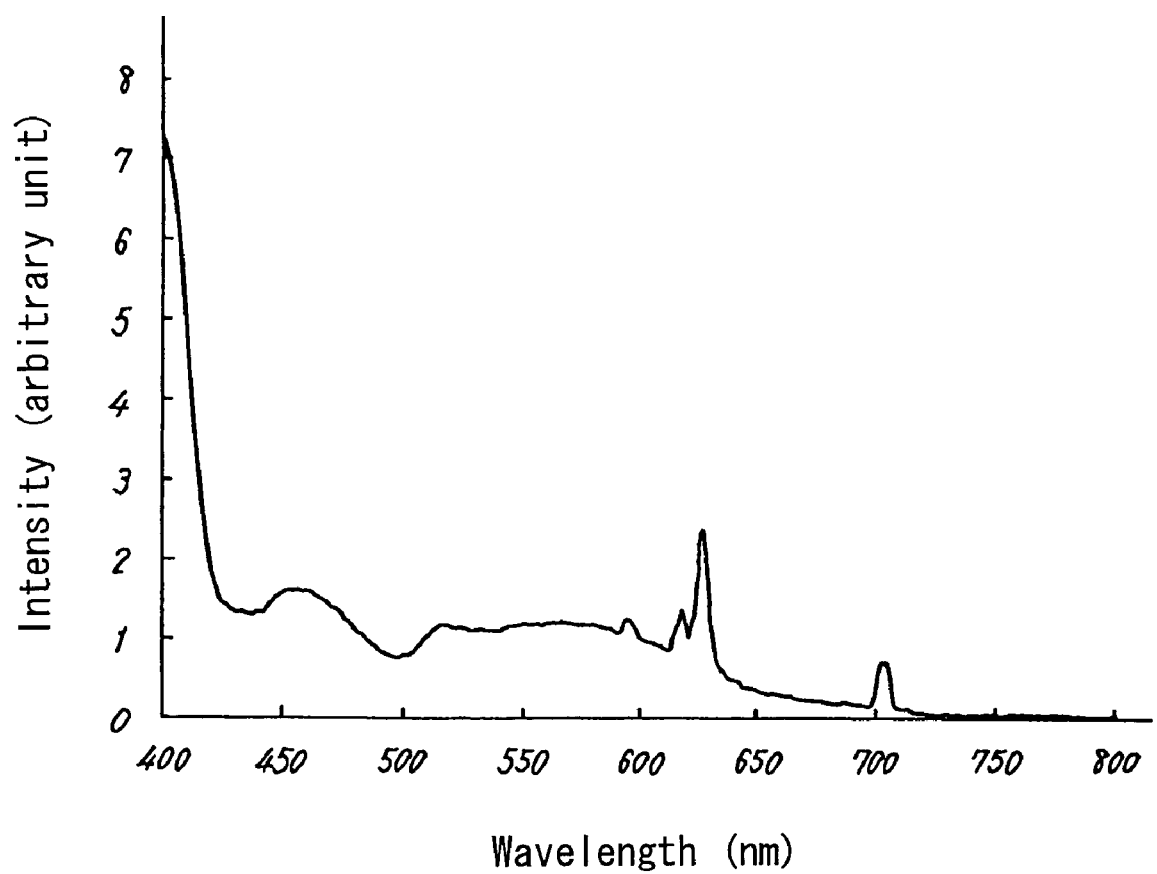
FIG. 12 is a diagram for showing an emission spectrum of a semiconductor light emitting device of Example 3.

In the same manner as in Examples 1 and 2, the color temperature, the Duv, the (x, y) values in the CIE chromaticity diagram, the Ra and the relative value of the luminous flux of the white-based light emitted by the semiconductor light emitting device were evaluated. The results are listed in Table 3. Furthermore, the emission spectra of the white-based light emitted by the semiconductor light emitting device of Example 3 is shown in FIG. 12. As is understood from Table 3, in obtaining the white-based light having substantially the same color temperature, substantially the same Duv and substantially the same chromaticity, the semiconductor light emitting device of Example 3 according to this invention attained higher luminous flux (of approximately 123%) and a larger Ra (of 92) than those of Example 1.

TABLE 3

| | Color temperature (K) | Duv | x | y | Ra | Relative luminous flux |
|---|---|---|---|---|---|---|
| Example 3 | 7880 | −9.7 | 0.301 | 0.293 | 92 | 2259 |

Example 4

A semiconductor light emitting device (of Example 4) was fabricated in the same manner as in Example 1 except that a blue-based phosphor represented by a chemical formula, $(M1_{1-x}Eu_x)_{10}(PO_4)_6Cl_2$ (wherein M1 is at least one alkali earth metal element selected from the group consisting of Ba, Sr, Ca and Mg, and x is a numerical value satisfying $0<x<1$), and specifically, a $(Sr, Ba)_{10}(PO_4)_6Cl_2:Eu^{2+}$ halophosphate blue phosphor (wherein M1=0.75Sr+0.25Ba and x=0.01) was used as the blue phosphor. An emission spectrum of the $(Sr, Ba)_{10}(PO_4)_6Cl_2:Eu^{2+}$ halophosphate blue phosphor obtained through the excitation by near UV of a wavelength of 380 nm is shown in FIG. 15(c).

The color temperature, the Duv, the chromaticity, the Ra and the relative value of the luminous flux of the white-based light emitted by the semiconductor light emitting device of Example 4 were evaluated. The results are listed in Table 4, and thus, the white-based light substantially the same as that obtained by the semiconductor light emitting device of Example 1 was obtained.

TABLE 4

| | Color temperature (K) | Duv | x | y | Ra | Relative luminous flux |
|---|---|---|---|---|---|---|
| Example 4 | 8480 | −12.2 | 0.297 | 0.284 | 66 | 1820 |

Example 5

The results obtained by evaluating the light emitting characteristics of the semiconductor light emitting device of this invention through simulation using a computer will now be described. As numerical data for use in the simulation evaluation, emission spectrum data of the following phosphors (1) through (4) actually measured (in a measurement wavelength range of 390 through 780 nm at a wavelength interval of 5 nm) by using the instantaneous multi photometric system (MCPD-7000; manufactured by Otsuka Electronics Co., Ltd.) through the excitation by near UV of a wavelength of 380 nm were used:

(1) $BaMgAl_{10}O_{17}:Eu^{2+}$ aluminate blue phosphor (see Example 3);

(2) $(Ba, Sr)MgAl_{10}O_{17}:Eu^{2+}, Mn^{2+}$ aluminate green phosphor (see Example 1);

(3) $La_2O_2S:Eu^{3+}$ oxysulfide red phosphor (see Example 1); and (4) $(Sr, Ba)_2SiO_4:Eu^{2+}$ silicate yellow phosphor having the orthorhombic crystal structure (see Example 1).

By using the ratio of illuminance derived from the yellow-based light emitted by the silicate yellow phosphor in the white-based light as a parameter, the emission spectrum intensity ratio among the blue light, the green light, the red light and the yellow light respectively emitted by the aluminate blue phosphor, the aluminate green phosphor, the oxysulfide red phosphor and the silicate yellow phosphor was optimized by using the computer so as to obtain white-based light with a color temperature of 8000 K and a Duv of 0, and the relative value of the luminous flux of the white-based light was calculated. The results are listed in Table 5.

TABLE 5

| Ratio of illuminance derived from $(Sr, Ba)_2SiO_4Eu^{2+}$ silicate yellow phosphor | Relative value of luminous flux of white-based light (with color temperature of 8000 K and Duv of 0) |
|---|---|
| 0% (no yellow phosphor) | 100 |
| 10% | 103 |
| 20% | 107 |
| 30% | 111 |
| 40% | 115 |
| 50% | 119 |
| 60% | 124 |
| 70% | 129 |
| 80% | 134 |

Table 5 reveals that the white-based light can attain higher luminous flux by adding the $(Sr, Ba)_2SiO_4:Eu^{2+}$ silicate yellow phosphor to the $BaMgAl_{10}O_{17}:Eu^{2+}$ aluminate blue phosphor, the $(Ba, Sr)MgAl_{10}O_{17}:Eu^{2+},Mn^{2+}$ aluminate green phosphor and the $La_2O_2S:Eu^{3+}$ oxysulfide red phosphor, and that the luminous flux can be improved by increasing the mixing ratio of the silicate yellow phosphor to a given content. Also, this theoretically supports the experiment results of Examples 1, 3 and 4 in which the semiconductor light emitting device attained higher luminous flux by further adding the silicate yellow phosphor to the phosphor layer composed of a mixture of the blue-based phosphor, the green-based phosphor and the red-based phosphor.

Figure 13A:
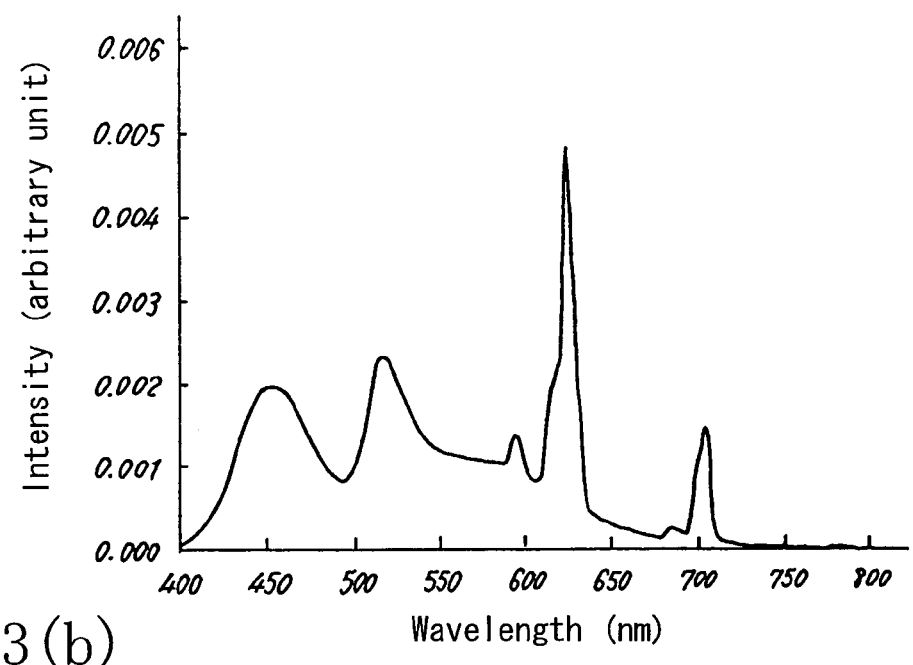
FIG. 13 is a diagram for showing emission spectra of white-based light obtained through simulation.
Figure 13B:
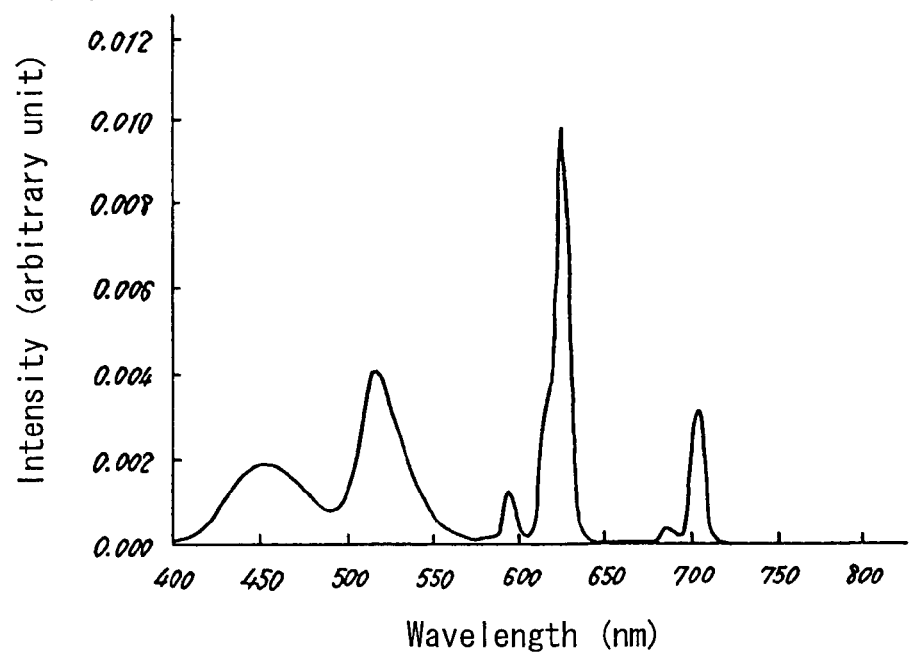

FIGS. 13(a) and 13(b) show examples of the emission spectrum of the simulated white-based light (with a color temperature of 8000 K and a Duv of 0). FIG. 13(a) shows a case where the ratio of illuminance derived from the (Sr, Ba)$_2$SiO$_4$:Eu$^{2+}$ silicate yellow phosphor is 50% and FIG. 13(b) shows a case where the ratio of the illuminance is 0%.

Example 6

The results obtained by subjecting the following phosphors (1) through (4) to the simulation evaluation similar to that of Example 5 are listed in Table 6:

(1) BaMgAl$_{10}$O$_{17}$:Eu$^{2+}$ aluminate blue phosphor (see Example 3);

(2) (Ba, Sr)$_2$SiO$_{17}$:Eu$^{2+}$ silicate green phosphor (see Example 2);

(3) La$_2$O$_2$S:Eu$^{3+}$ oxysulfide red phosphor (see Example 1); and (4) (Sr, Ba)$_2$SiO$_4$:Eu$^{2+}$ silicate yellow phosphor having the orthorhombic crystal structure (see Example 1).

In the same manner as in Example 5, the ratio of illuminance derived from the yellow-based light emitted by the silicate yellow phosphor in the white-based light is used as a parameter, the relative value of the luminous flux of the resultant white-based light was calculated. Each relative value of the luminous flux of the white-based light listed in Table 6 is a relative value obtained by assuming, as 100, the luminous flux obtained when the ratio of the illuminance derived from the (Sr, Ba)$_2$SiO$_4$:Eu$^{2+}$ silicate yellow phosphor is 0% in Example 5.

TABLE 6

| Ratio of illuminance derived from (Sr, Ba)$_2$SiO$_4$Eu$^{2+}$ silicate yellow phosphor | Relative value of luminous flux of white-based light (with color temperature of 8000 K and Duv of 0) |
|---|---|
| 0% (no yellow phosphor) | 120 |
| 10% | 122 |
| 20% | 124 |
| 30% | 126 |
| 40% | 129 |
| 50% | 131 |
| 60% | 134 |
| 70% | 136 |

Table 6 reveals, similarly to Example 5, that the white-based light can attain higher luminous flux by adding the (Sr, Ba)$_2$SiO$_4$:Eu$^{2+}$ silicate yellow phosphor to the BaMgAl$_{10}$O$_{17}$:Eu$^{2+}$ aluminate blue phosphor, the (Ba, Sr)$_2$SiO$_4$:Eu$^{2+}$ silicate green phosphor and the La$_2$O$_2$S:Eu$^{3+}$ oxysulfide red phosphor, and that the luminous flux can be improved by increasing the mixing ratio of the silicate yellow phosphor to a given content. Also, this theoretically supports the experiment result of Example 2 in which the semiconductor light emitting device attained higher luminous flux by further adding the silicate yellow phosphor to the phosphor layer composed of a mixture of the blue-based phosphor, the green-based phosphor and the red-based phosphor.

Figure 14A:
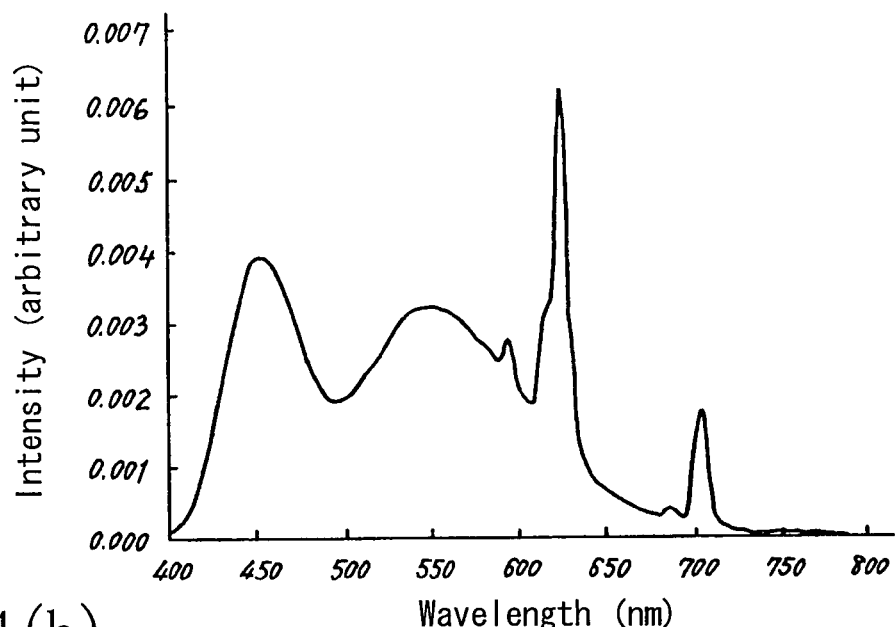
FIG. 14 is a diagram for showing emission spectra of white-based light obtained through simulation.
Figure 14B:
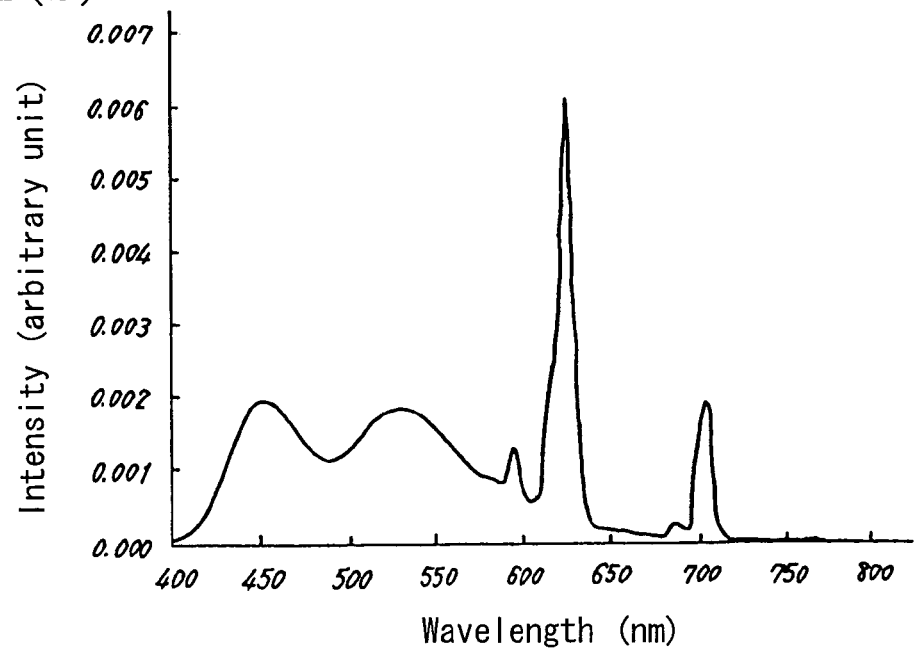

FIGS. 14(a) and 14(b) show examples of the emission spectrum of the simulated white-based light (with a color temperature of 8000 K and a Duv of 0). FIG. 14(a) shows a case where the ratio of illuminance derived from the (Sr, Ba)$_2$SiO$_4$:Eu$^{2+}$ silicate yellow phosphor is 50% and FIG. 14(b) shows a case where the ratio of the illuminance is 0%.

In this manner, also through the simulation evaluation, it has been proved that the semiconductor light emitting device of this invention emits white-based light with higher luminous flux than a conventional semiconductor light emitting device.

INDUSTRIAL APPLICABILITY

The semiconductor light emitting device of this invention is a semiconductor light emitting device composed of a combination of a near UV LED and a phosphor layer including a plurality of phosphors respectively absorbing near UV of a wavelength in the vicinity of 350 through 410 nm emitted by the near UV LED and emitting fluorescence having emission peaks in a visible wavelength region not less than 380 nm and not more than 780 nm. Since the phosphor layer includes four kinds of phosphors, that is, a blue-based phosphor, a green-based phosphor, a red-based phosphor and a yellow-based phosphor, lowering of luminous flux derived from red-based light with low luminosity is compensated by yellow-based light with comparatively high luminosity, and the resultant white-based light can be well color balanced, and hence, the semiconductor light emitting device can emit white-based light with high luminous flux and a large Ra. In particular, when a silicate phosphor is used as the yellow-based phosphor, the invention provides a semiconductor light emitting device with luminous efficiency much higher than that of a conventional semiconductor light emitting device using a YAG-based phosphor.

Also, the semiconductor light emitting apparatus of this invention is composed of a combination of a near UV LED and a phosphor layer including four kinds of phosphors, that is, a blue-based phosphor, a green-based phosphor, a red-based phosphor and a yellow-based phosphor, and thus, the invention provides a semiconductor light emitting apparatus for emitting white-based light with high luminous flux and a large Ra.

The invention claimed is:

1. A semiconductor light emitting device for emitting white-based light having a luminescent chromaticity point (x, y) in the CIE chromaticity diagram of $0.21 \leq x \leq 0.48$ and $0.19 \leq y \leq 0.45$, comprising a combination of:

a near ultraviolet light emitting element for emitting light having an emission peak in a wavelength region exceeding 350 nm and not more than 410 nm; and a phosphor layer including a plurality of phosphors for absorbing near ultraviolet emitted by said near ultraviolet light emitting element and for emitting fluorescence having an emission peak in a visible wavelength region not less than 380 nm and not more than 780 nm, wherein said phosphor layer includes four kinds of phosphors: a blue-based phosphor for emitting blue-based fluorescence having an emission peak in a wavelength region not less than 400 mm and less than 500 nm; a green-based phosphor for emitting green-based fluorescence having an emission peak in a wavelength region not less than 500 nm and less than 550 nm; a red-based phosphor for emitting red-based fluorescence having an emission peak in a wavelength region not less than 600 nm and less than 660 nm; and a yellow-based phosphor for emitting yellow-based fluorescence having an emission peak in a wavelength region not less than 550 nm and less than 600 nm, and wherein said yellow-based phosphor is a silicate phosphor having an orthorhombic crystal structure and principally including a compound represented by the following chemical formula:

$$(Sr_{1-a1-b1-x}Ba_{a1}Ca_{b1}Eu_x)_2SiO_4$$

wherein a1, b1 and x are numerical values satisfying $0 \leq a1 \leq 0.3$, $0 \leq b1 \leq 0.8$, $0 < x < 1$.

2. The semiconductor light emitting device of claim 1, wherein said silicate phosphor is a silicate phosphor principally including a compound represented by the following chemical formula:

$$(Sr_{1-a1-b2-x}Ba_{a1}Ca_{b2}Eu_x)_2SiO_4$$

wherein a1, b2 and x are numerical values satisfying $0 \leq a1 \leq 0.3$, $0 \leq b2 \leq 0.6$, $0 < x < 1$.

3. The semiconductor light emitting device of claim 1 or 2, wherein said blue-based phosphor is either of the following blue-based phosphors (1) and (2), said green-based phosphor is either of the following green-based phosphors (3) and (4), and said red-based phosphor is the following red-based phosphor (5):

(1) a halophosphate phosphor principally including a compound represented by the following chemical formula:
$(M1_{1-x}Eu_x)_{10}(PO_4)_6Cl_2$, wherein M1 is at least one alkali earth metal element selected from the group consisting of Ba, Sr, Ca and Mg, and x is a numerical value satisfying $0 < x < 1$;

(2) an aluminate phosphor principally including a compound represented by the following chemical formula:
$(M2_{1-x}Eu_x)(M3_{1-y1}Mn_{y1})Al_{10}O_{17}$, wherein M2 is at least one alkali earth metal element selected from the group consisting of Ba, Sr and Ca, M3 is at least one element selected from the group consisting of Mg and Zn, and x and y1 are numerical values satisfying $0 < x < 1$ and $0 \leq y1 < 0.05$;

(3) an aluminate phosphor principally including a compound represented by the following chemical formula:
$(M2_{1-x}Eu_x)(M3_{1-y2}Mn_{y2})Al_{10}O_{17}$, wherein M2 is at least one alkali earth metal element selected from the group consisting of Ba, Sr and Ca, M3 is at least one element selected from the group consisting of Mg and Zn, and x and y2 are numerical values satisfying $0 < x < 1$ and $0.05 \leq y2 < 1$;

(4) a silicate phosphor principally including a compound represented by the following chemical formula:
$(M1_{1-x}Eu_x)_2SiO_4$, wherein M1 is at least one alkali earth metal element selected from the group consisting of Ba, Sr, Ca and Mg and x is a numerical value satisfying $0 < x < 1$; and (5) an oxysulfide phosphor principally including a compound represented by the following chemical formula:
$(Ln_{1-x}Eu_x)_2O_2S$, wherein Ln is at least one rare earth element selected from the group consisting of Sc, Y, La and Gd and x is a numerical value satisfying $0 < x < 1$.

4. The semiconductor light emitting device of claim 1 or 2, wherein said near ultraviolet light emitting element includes a light emitting layer made of a gallium nitride-based compound semiconductor.

5. The semiconductor light emitting device of claim 4, wherein said white-based light emitted by said light emitting device has an average number of color rendering (Ra) not less than 70 and less than 100.

6. A semiconductor light emitting apparatus comprising the semiconductor light emitting device of claim 1 or 2.

* * * * *

UNITED STATES PATENT AND TRADEMARK OFFICE
CERTIFICATE OF CORRECTION

PATENT NO. : 7,294,956 B2  Page 1 of 1
APPLICATION NO. : 10/491411
DATED : November 13, 2007
INVENTOR(S) : Toshihide Maeda et al.

It is certified that error appears in the above-identified patent and that said Letters Patent is hereby corrected as shown below:

On title page of the Letters Patent;

Under section (54), change "SEMICONDUCTOR LIGHT EMITTING ELEMENT AND LIGHT EMITTING DEVICE USING THIS" to -- SEMICONDUCTOR LIGHT EMITTING DEVICE AND LIGHT EMITTING APPARATUS USING THE SAME, --

Under section (75) Inventors:, change:
"Shonzo Oshio, Hirakata (JP)" to -- Shonzo Oshio, Osaka (JP) --
"Katsuaki Iwama, Suita (JP)" to -- Katsuaki Iwama, Osaka (JP) --

Under section (56) References Cited, OTHER PUBLICATIONS, change:
"Thomas L. Barry, "Fluorescence of $EU^{2+}$ - Activated Phases in Bunary Alkaline Earth Orthosilicate Systems", J. Electrochemical Soc., Solid State Science, vol. 115, No. 11, pp. 1181-1184, Nov. 1968." to -- Thomas L. Barry, "Fluorescence of $EU^{2+}$ - Activated Phases in Binary Alkaline Earth Orthosilicate Systems", J. Electrochemical Soc., Solid State Science, vol. 115, No. 11, pp. 1181-1184, Nov. 1968 --

Signed and Sealed this

Second Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,294,956 B2
APPLICATION NO. : 10/491411
DATED : November 13, 2007
INVENTOR(S) : Toshihide Maeda et al.

It is certified that error appears in the above-identified patent and that said Letters Patent is hereby corrected as shown below:

On title page of the Letters Patent;

Under section (54), and Column 1, lines 1-3, change "SEMICONDUCTOR LIGHT EMITTING ELEMENT AND LIGHT EMITTING DEVICE USING THIS" to -- SEMICONDUCTOR LIGHT EMITTING DEVICE AND LIGHT EMITTING APPARATUS USING THE SAME, --

Under section (75) Inventors:, change:
"Shonzo Oshio, Hirakata (JP)" to -- Shonzo Oshio, Osaka (JP) --
"Katsuaki Iwama, Suita (JP)" to -- Katsuaki Iwama, Osaka (JP) --

Under section (56) References Cited, OTHER PUBLICATIONS, change:
"Thomas L. Barry, "Fluorescence of $EU^{2+}$ - Activated Phases in Bunary Alkaline Earth Orthosilicate Systems", J. Electrochemical Soc., Solid State Science, vol. 115, No. 11, pp. 1181-1184, Nov. 1968." to -- Thomas L. Barry, "Fluorescence of $EU^{2+}$ - Activated Phases in Binary Alkaline Earth Orthosilicate Systems", J. Electrochemical Soc., Solid State Science, vol. 115, No. 11, pp. 1181-1184, Nov. 1968 --

This certificate supersedes the Certificate of Correction issued September 2, 2008.

Signed and Sealed this

Twenty-eighth Day of October, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,294,956 B2 | Page 1 of 1 |
| APPLICATION NO. | : 10/491411 | |
| DATED | : November 13, 2007 | |
| INVENTOR(S) | : Toshihide Maeda et al. | |

It is certified that error appears in the above-identified patent and that said Letters Patent is hereby corrected as shown below:

On title page of the Letters Patent;

Under section (54), and Column 1, lines 1-3, change "SEMICONDUCTOR LIGHT EMITTING ELEMENT AND LIGHT EMITTING DEVICE USING THIS" to -- SEMICONDUCTOR LIGHT EMITTING DEVICE AND LIGHT EMITTING APPARATUS USING THE SAME, --

Under section (75) Inventors:, change:
"Shonzo Oshio, Hirakata (JP)" to -- Shozo Oshio, Osaka (JP) --
"Katsuaki Iwama, Suita (JP)" to -- Katsuaki Iwama, Osaka (JP) --

Under section (56) References Cited, OTHER PUBLICATIONS, change:
"Thomas L. Barry, "Fluorescence of $EU^{2+}$ - Activated Phases in Bunary Alkaline Earth Orthosilicate Systems", J. Electrochemical Soc., Solid State Science, vol. 115, No. 11, pp. 1181-1184, Nov. 1968." to -- Thomas L. Barry, "Fluorescence of $EU^{2+}$ - Activated Phases in Binary Alkaline Earth Orthosilicate Systems", J. Electrochemical Soc., Solid State Science, vol. 115, No. 11, pp. 1181-1184, Nov. 1968 --

This certificate supersedes the Certificates of Correction issued September 2, 2008 and October 28, 2008.

Signed and Sealed this

Third Day of February, 2009

JOHN DOLL
*Acting Director of the United States Patent and Trademark Office*